(12) United States Patent
Leong et al.

(10) Patent No.: US 8,912,447 B2
(45) Date of Patent: Dec. 16, 2014

(54) METHOD OF MOULDING

(71) Applicant: Fischer Technology Pte. Ltd., Singapore (SG)

(72) Inventors: Chee Seng Leong, Singapore (SG); Sze Lam Chua, Singapore (SG)

(73) Assignee: Fischer Technology Pte. Ltd., Singapore (SG)

( * ) Notice: Subject to any disclaimer, the term of this patent is extended or adjusted under 35 U.S.C. 154(b) by 0 days.

(21) Appl. No.: 14/111,698

(22) PCT Filed: Oct. 9, 2012

(86) PCT No.: PCT/SG2012/000379
§ 371 (c)(1),
(2), (4) Date: Oct. 14, 2013

(87) PCT Pub. No.: WO2013/058708
PCT Pub. Date: Apr. 25, 2013

(65) Prior Publication Data
US 2014/0036428 A1    Feb. 6, 2014

Related U.S. Application Data

(63) Continuation-in-part of application No. PCT/SG2012/000295, filed on Aug. 21, 2012.

(30) Foreign Application Priority Data

Oct. 18, 2011  (SG) ................ 201107618-9

(51) Int. Cl.
*H05K 1/00*     (2006.01)
*H01R 43/00*    (2006.01)
(Continued)

(52) U.S. Cl.
CPC ............. *H05K 3/10* (2013.01); *H03K 17/9622* (2013.01); *H05K 7/02* (2013.01); *H03K 2217/960755* (2013.01); *H03K 2217/960785* (2013.01); *B29C 53/04* (2013.01); *B32B 2457/00* (2013.01); *B29L 2031/3437* (2013.01); *B29C 45/14811* (2013.01); *B29C 45/1671* (2013.01)
USPC .................. 174/254; 29/825; 29/846; 29/847

(58) Field of Classification Search
None
See application file for complete search history.

(56) References Cited

U.S. PATENT DOCUMENTS 8,551,308 B2 * 10/2013 Bhullar et al. ............ 204/403.01
8,707,551 B2 *  4/2014 Amey et al. .................... 29/829
(Continued)

FOREIGN PATENT DOCUMENTS

EP       2322345 A1      5/2011
JP    2005-167216 A      6/2005
(Continued)

OTHER PUBLICATIONS

Foreign Communication from a Related Counterpart Application, "Office Action" dated Feb. 25, 2014, Singapore Application No. 2013-547405, 2 pages.

(Continued)

*Primary Examiner* — Dion R Ferguson

(57) ABSTRACT

A method includes patterning one or more electrical layers on a substrate; shaping the patterned substrate into a 3-dimensional contour, wherein the contour including a significant change in gradient in or adjacent to one or more sensing areas of the electrical layer, and over-molding the shaped substrate. Degradation of a trace in the electrical layer at or adjacent to the one or more sensing areas during shaping and/or over-molding is substantially minimized based on the width of the trace, the thickness or number of layers of the trace, the bending radius of the trace, the material of the trace, and/or a primer over layer on the trace.

20 Claims, 26 Drawing Sheets

(51) Int. Cl.
*H05K 3/00* (2006.01)
*H05K 3/10* (2006.01)
*H03K 17/96* (2006.01)
*H05K 7/02* (2006.01)
*B29C 53/04* (2006.01)
*B29L 31/34* (2006.01)
*B29C 45/14* (2006.01)
*B29C 45/16* (2006.01)

(56) References Cited

U.S. PATENT DOCUMENTS

2011/0242051 A1* 10/2011 Philipp et al. .................. 345/174
2012/0273259 A1* 11/2012 Palin .............................. 174/254

FOREIGN PATENT DOCUMENTS

| JP | 2009009859 A | 1/2009 |
| JP | 2010-267607 A | 11/2010 |
| WO | 2008131305 A1 | 10/2008 |
| WO | 2013058708 A1 | 4/2013 |

OTHER PUBLICATIONS

Foreign Communication from a Related Counterpart Application, International Search Report and Written Opinion, dated Jan. 28, 2013 International Application No. PCT/SG12/00379, filed on Oct. 9, 2012, 7pgs.

Foreign Communication from a Related Counterpart Application, International Preliminary Report on Patentability, dated Jul. 1, 2013, International Application No. PCT/SG12/00379, filed on Oct. 9, 2012, 15pgs.

Leong, Chee Seng, et al., Singapore Patent Application entitled, "A Method of Making an Electronic Apparatus Incorporating a Contoured Functional Film", filed on Oct. 18, 2011.

Leong, Chee Seng, et al., International Application No. PCT/SG12/00295, entitled, "A Method of Making an Electronic Apparatus Incorporating a Contoured Functional Film", filed on Aug. 21, 2012.

* cited by examiner (Section A-A of Fig. 2B)

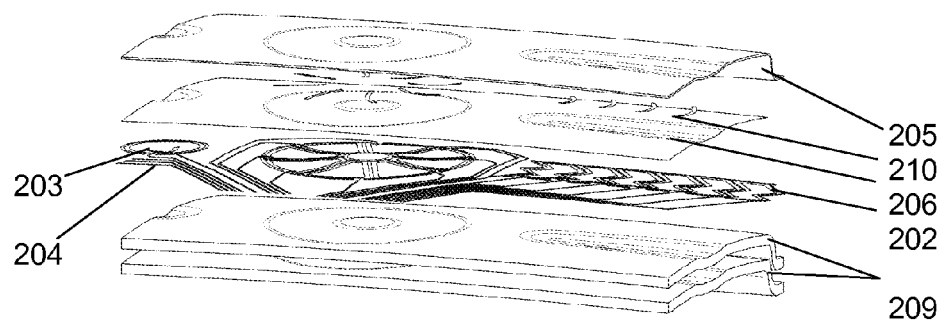
Fig. 2D1
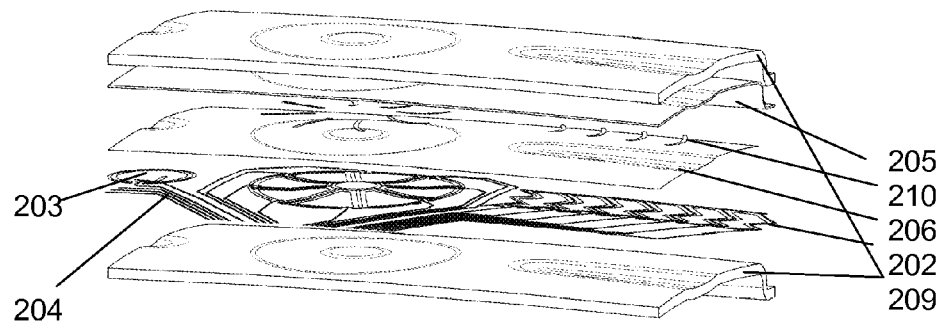
Fig. 2D2

The compression elastomer pushes the flex cable against the printed conductive trace, i.e. to crate high contact force and also prevent disconnection during vibration.

Flexible printed circuit board or flexible cable

Flexible printed circuit board or flexible cable

ACF

Zebra connector electrically connecting printed conductive traces and PCB

Exposed traces
Zebra connector electrically connecting the printed conductive traces and PCB Detent Friction

METHOD OF MOULDING

FIELD OF THE INVENTION

The present invention relates generally to a method of moulding.

CROSS-REFERENCE TO RELATED APPLICATIONS

The present application is a National Stage application of International Application No. PCT/SG2012/000379. International Application No. PCT/SG2012/000379 was filed in the Intellectual Property Office of Singapore within one-year of and claims priority to both Singapore Application No. 201107618-9 and International Application No. PCT/SG2012/000295. Accordingly, this application is a filing under 35 U.S.C. 371 as the National Stage of International Application No. PCT/SG2012/000379, filed Oct. 9, 2012, entitled "A METHOD OF MOULDING," by Chee Seng LEONG, et al., which is a continuation-in-part under 35 U.S.C. 120 of and claims the benefit of International Application No. PCT/SG2012/000295, filed Aug. 21, 2012, entitled "A METHOD OF MAKING AN ELECTRONIC APPARATUS INCORPORATING A CONTURED FUNCTIONAL FILM," by Chee Seng LEONG, et al., and claims foreign priority under 35 U.S.C. 119 to Singapore Patent Application No. 201107618-9, filed with the Intellectual Property Office of Singapore on Oct. 18, 2011 and entitled "A METHOD OF MAKING AN ELECTRONIC APPARATUS INCORPORATING A CONTOURED FUNCTIONAL FILM", by Ghee Seng LEONG, et al., each of which are incorporated herein by reference in their entirety for all purposes.

BACKGROUND

Electronic interfaces are commonly used in a wide range of applications from consumer products including computer systems, game consoles, electrical appliances, in-vehicle systems including automotive consoles or central stacks and wheel mounted controls, portable devices including audio devices, multimedia players, cellular phones or the like, to industrial control consoles, switches, or the like. While mechanical buttons, switches, contacts and the like have typically been used in connection with conventional electronic input devices, there has been a shift away from the use of mechanical buttons, switches and the like toward low activation pressure technologies such as touch sensitive switches. Integrating touch sensor technologies into input devices in connection with products such as touch panels, touch screens, and capacitive keypads and the like has increased due to the development in capacitive sensing technologies. Such technologies generally locate the area of touch sensitivity within the bounds of a flat region on a panel of a device such as a display or the like, which can be glass, plastic, film or the like, and is often located over a display.

It will be appreciated however that, while advantages can be gained by the use of touch sensitive controls on computer screens and flat panel input areas, certain limitations exist for integrating touch sensitive technology into moulded articles. Currently, regardless of the desired shape of the device, the design is predominated by the need for a flat area into which or onto which a touch sensitive input device can be mounted. The electronics and plastic parts are generally then assembled to form a product requiring multiple steps of subassembly integration, test, final assembly, final test and the like. Touch sensitive areas are required to be flat because there are generally no known touch sensor switches and or other film based technology that can be readily integrated into a shaped structure having contours within the touch sensitive areas.

In recent years, due to the development of better printing methodologies and inks with special functions such as conductive inks, and the like, film insert moulding (FIM) processes have been used to manufacture touch sensor devices and lighting devices, e.g. using electroluminescent (EL) technologies in connection with film articles. Further, FIM process has been used to incorporate elements such as a switches and the like into film articles. After the printing and forming process is completed and a film article is produced, the printed film articles can be further subjected to moulding processes including: injection moulding or thermoforming processes.

For example, resistive and shielded elements are disclosed in International Application Publication Number WO 2009/128856, and a capacitive switch is disclosed in International Application Publication Number WO 2008/131305 to Haag, et al. While Haag describes various configurations in which films using conductive inks can be formed, the problem of cracking during formation is acknowledged. Haag fails to describe how to select variables associated with the ink avoid cracking. Haag avoids spanning the inks within the sensing zones and does not propose to substantially solve problems associated with cracking and the like in those zones.

Still further, while capacitive switches and lighting materials have been used in electronic devices, integrating known touch sensitive elements and lighting into film structures has posed challenges, although conventional FIM capacitive touch panels are available in 2-dimensional form. FIG. 1 shows an assembly of parts that make up a prior art touch panel 100. In particular, touch panel 100 can include a formable film 105, a graphic layer 104, and a plurality of layers 101, 102, 103. The plurality of layers 101, 102, 103 may consist of conductive ink printed on the graphic layer 104 to form a touch sensor zone. However, layers formed from such conductive inks are generally brittle and are susceptible to cracking during forming processes as is acknowledged in the art.

SUMMARY OF THE INVENTION

In general terms in a first aspect the invention proposes to minimise the problem of cracking in the conductive tracks in contoured sensing zones. This may have the advantage that the electronic interface can be more attractive and/or user friendly and/or manufacturing can be more cost effective.

In an embodiment, a conductive ink or paste layer is printed on a substrate film and cured to form a proximity or touch sensing layer. A transparent grounding layer including conductive ink and primer are printed on the touch sensing layer for grounding. A lighting layer is printed and cured after the grounding layers. The primer layer may aid adhesion between each layer and provide insulation. The grounding layer may eliminate or minimise interference between the touch sensing layer and the lighting layer. The transmissivity of the conductive ink, grounding and/or primer can be set so as to allow a quantity of light from the lighting layer to pass through.

In a second aspect the invention proposes an interconnect between a film insert moulded interface and a controller, the interconnect selected from the group consisting of:
  a conductive ink circuit or pig tail,
  an anisotropic conductive film adhesive on a side wall, parallel to and/or close to an appearance surface, an anisotropic conductive film adhesive on a side wall, parallel to and/or close to an appearance surface with a compression load, an anisotropic conductive film adhesive behind a decorative surface, an anisotropic conductive film adhesive behind a decorative surface with an elastomeric fastening, an anisotropic conductive film adhesive on a side wall, perpendicular and/or close to an appearance surface, an elastomeric connector behind a decorative surface, and an elastomeric connector on side wall; parallel to and/or close to an appearance surface.

In a third aspect the invention proposes a film insert moulded electronic interface with touch and/or proximity sensors including haptic feedback, the haptic feedback selected from the group consisting of: lighting of the sensors, mass/weight of sensor threshold, stiffness/detents, viscosity/damping, roughness/texture of the sensor, pulses, waveforms, vibrations and any combination thereof.

In a specific expression of the invention there is provided a method as claimed in claim 1. Embodiments may be implemented according to one of claims 2 to 18.

In an embodiment, a surface characteristic can be achieved by pre-processing the film or by surface coating, eg: Spray, dipping or a mixture integration such as adding of masterbatch prior the plastic moulding process.

BRIEF DESCRIPTION OF THE DRAWINGS

In order that embodiments of the invention may be fully and more clearly understood by way of non-limitative examples, the following description is taken in conjunction with the accompanying drawings in which like reference numerals designate similar or corresponding elements, regions and portions, and in which:

FIG. 2D1 is an exploded view of the touch with regular FIM panel assembly having the various layers;

FIG. 2D2 is an exploded view of the touch with reversed FIM panel assembly having the various layers;

DETAILED DESCRIPTION

Figure 2A:
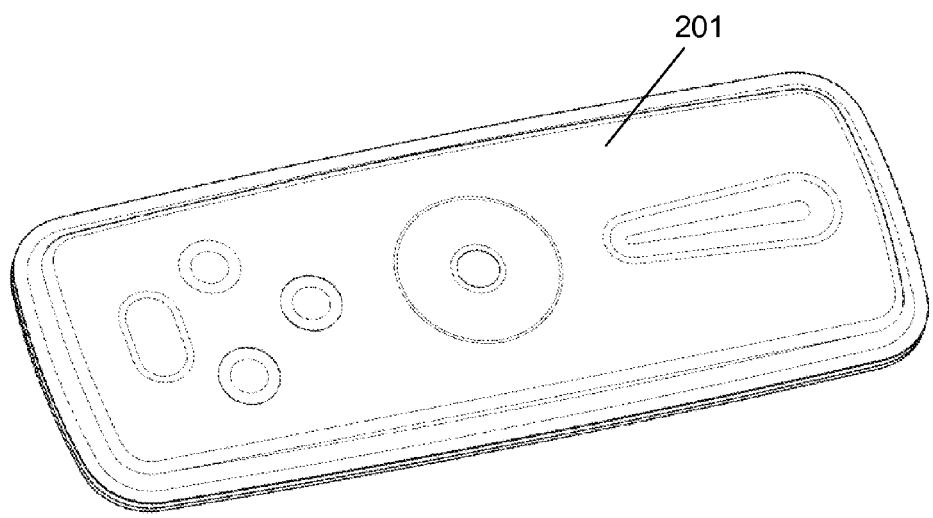
FIG. 2A is a perspective view of a touch panel assembly having a 3-dimensional shape.
Figure 2B:
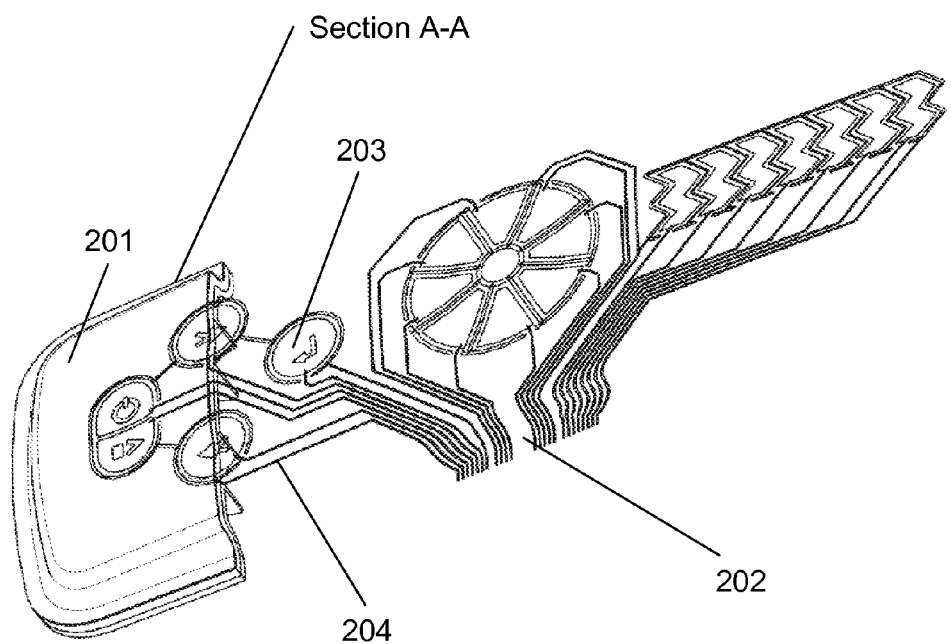
FIG. 2B is a part cut-out view of the touch panel assembly.

In an embodiment, a true 3-D moulded article including contours spanning sensing is shown in FIGS. 2A and 2B. A touch panel assembly 200 includes a moulded panel 201 having a functional layer 202, such as an electrical layer made from conductive paste. The functional layer 202 can be a paste configured so as to allow additional flexibility and workability while maintaining characteristics such as conductivity. FIM processes are commonly used for printing decorative designs; the decorative printed surface can be used to apply the functional layer 202, such as by a silkscreen printing process or inkjet printing.

After the printing process for the functional layer 202 is completed, the functional layer 202 can be formed and worked, such as moulded into the moulded panel 201 to form the touch panel assembly 200. Initial forming or shaping can refer to processes that are used to shape the film permanently include processes such as high pressure forming, thermoforming and the like. The formed articles can then be subject to additional moulding such as injection moulding processes that can be used to over-mould the formed films into a more conventional plastic package. Connector areas may be left exposed or un-encapsulated.

FIG. 2B shows a cut-away section of the touch panel assembly 200 of FIG. 2A. In an embodiment, the functional ink layer 202 can be printed with a plurality of electrodes 203, and a plurality of traces 204 connecting the electrodes 203 to form an electrical circuit. The functional ink layer 202 can be a touch sensor layer and/or lighting layer. The functional ink on the functional ink layer 202 has an ink material characteristic which can be set by controlling an admixture of the ink and one or more additional constituents according to a specific ratio or ratios, so as to enable the functional ink layer to be shaped while maintaining an acceptable level of conductivity after the forming. If the functional ink layer is a touch sensor layer, this acceptable level of conductivity is a range in which the touch sensor retains its touch sensitive capability. If the functional ink layer is a lighting layer, this acceptable level of conductivity is a range in which the lighting layer can emit light.

Figure 2C:
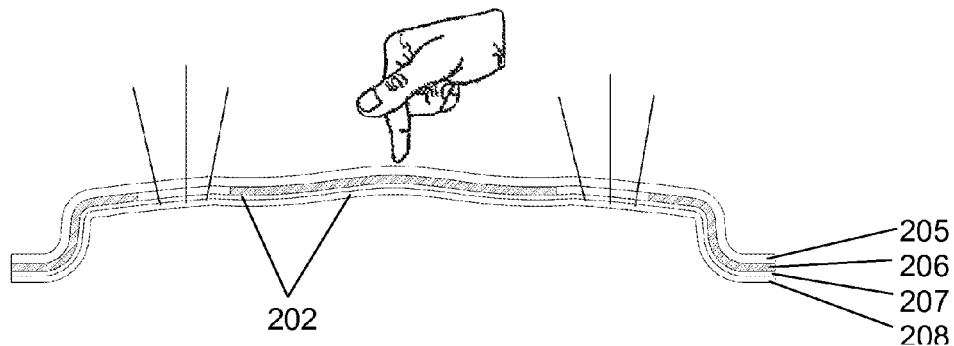
FIG. 2C is a cross-sectional view of the touch panel assembly.

FIG. 2C shows a sectional view A-A from FIG. 2B, where the touch panel assembly 200 can include a film 205, a decorative layer 206 printed on the film 205, a functional ink layer 202 which can be a touch sensor layer 207 and/or a lighting layer 208. The touch sensor layer 207 can be configured and applied as an electrical circuit that includes, for example, capacitive switches capable of detecting a change in capacitance when an object such as a finger comes into contact or proximity thereto. Such a switch can perform functions of a mechanical switch such as a rotary switch, a slider switch, a push button switch, or the like, with greatly reduced friction and the elimination of moving parts, which can become an expensive liability. Such touch sensor switches can be widely used in home appliances, such as in touch panels for dishwashers, washing machines, coffee makers, and the like, photocopiers, space heaters, audio systems, and the like, portable devices such as iPods, mobile phones, and the like, and automotive electronics systems such as audio systems, handles and controls located, for example within the central stack. In particular, the functional ink layer 202 (i.e. the touch sensor layer 207 and/or the lighting layer 208) can be advantageously configured to be formed into a three-dimensional shape, including contours that span sensing zones, without cracking or otherwise losing its electrical integrity for the purposes of touch sensor, emitting light or the like.

To better illustrate the configuration of moulding process prior completion of touch panel assembly, FIG. 2D2 shows an exploded view of a touch panel assembly 200 having a 3-dimensional shape; arranged or structured in reverse FIM configuration.

The touch panel assembly 200 has a film substrate 205. The decorative ink layer 210 and a functional ink layer 202 are printed on the film substrate 205. A thermoplastic moulding 209 is moulded on the A-surface of the film substrate 205.

Figure 1:
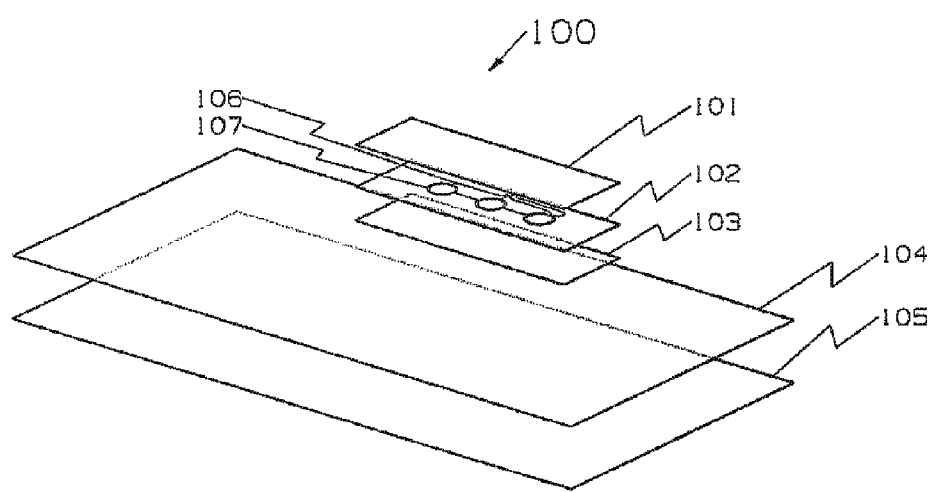
FIG. 1 is a diagram illustrating a prior art touch panel.

FIG. 2D1 illustrates an exploded view of a touch panel assembly 200 having a 3-dimensional shape; in regular FIM configuration. The touch panel assembly 200 has a film substrate 205. The decorative ink layer 210 and a functional ink layer 202 are printed on the film substrate 205. A thermoplastic moulding 209 is moulded on the B-surface of the film substrate 205.

Decorative graphics 210 and a decorative layer 206 can be printed on the film 205, or the functional ink layer 202 can be printed directly on the decorative layer 206. In some instances, the electrodes 203 are printed with transparent conductive ink, such that they are transparent and conductive. The traces 204 are translucent or opaque.

Figure 3A:
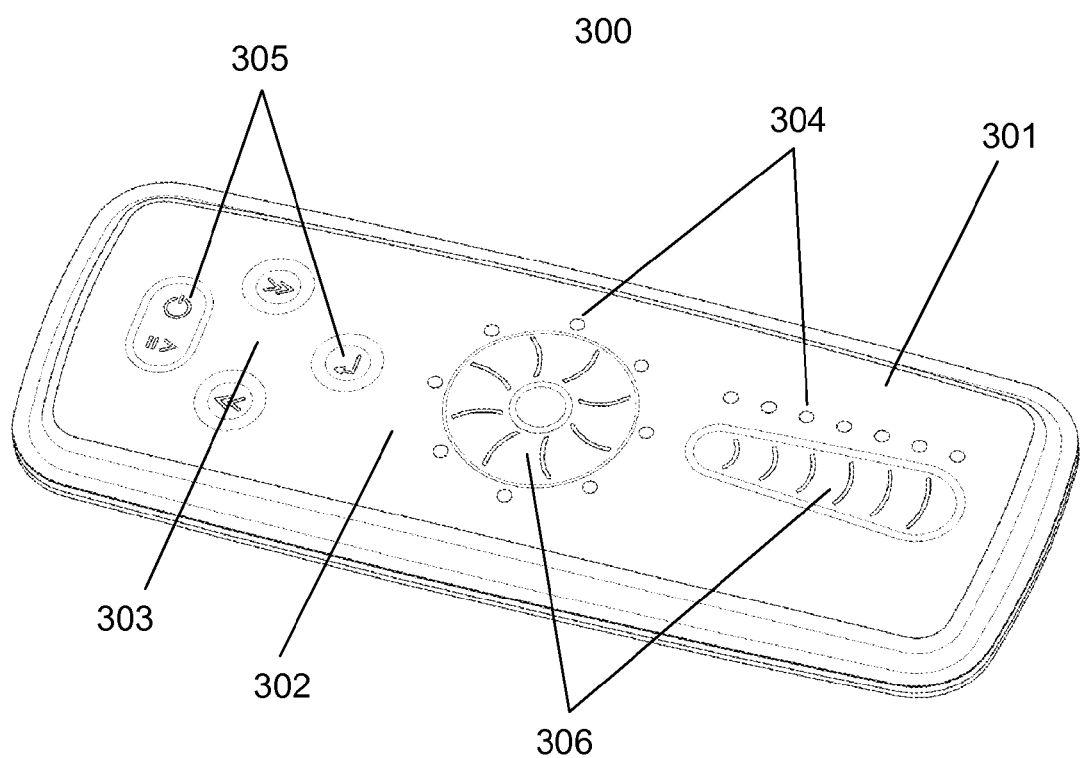
FIG. 3A is a perspective view of an electronic apparatus.
Figure 3B:
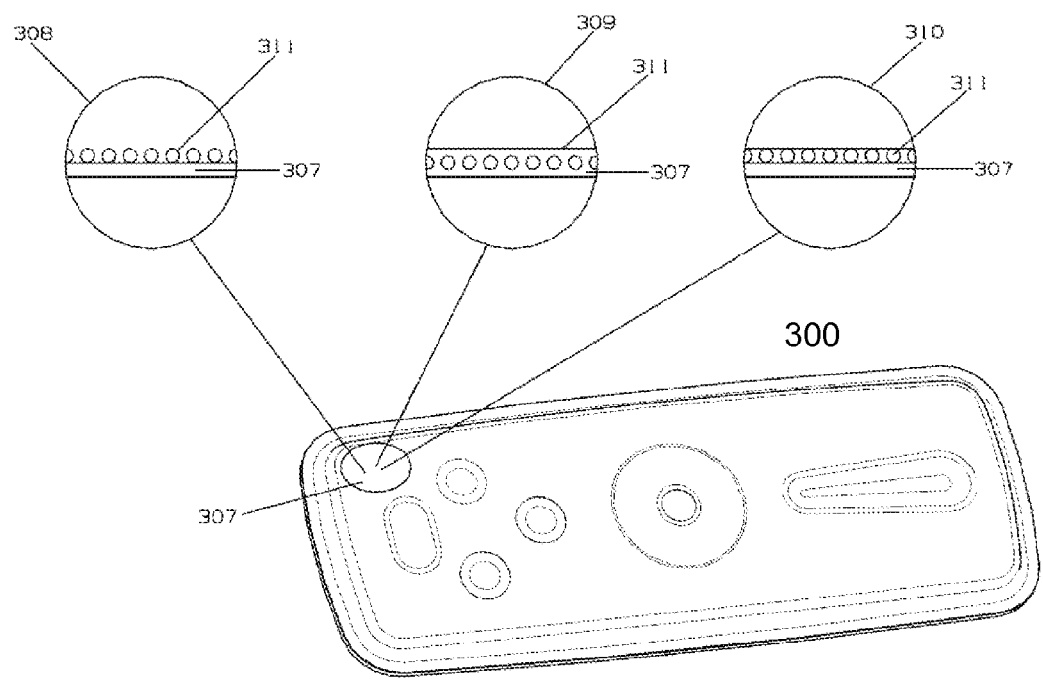
FIG. 3B is a perspective view of an electronic apparatus.

To better understand how various layers can be combined to form a functional article, FIGS. 3A and 3B illustrate an electronic apparatus 300 having a 3-dimensional shape according to an embodiment. The electronic apparatus 300 has a moulded panel 301 including a functional ink layer, which is not directly shown. The printed and formed film substrate can be moulded so as to have a functional area 303, 306. The functional areas 303, 306 may be spanned by a contoured portion associated with the 3-dimensional shape. Each of the functional areas 303 and 306 can include a backlighting area 304 and symbol 305.

The film layer 302 can be formed after printed a decorative ink layer and functional ink layer on a plastic film substrate. A material which compatible with the film substrate can be used for moulding processes, such as for example thermoplastic materials including polycarbonate, polyester, and the like.

As shown in FIG. 3B, the electronic apparatus 300 can be provided with a surface characteristic of a surface 307 in accordance with different applications such as anti-microbial, and the like. For example, the surface characteristic may be configured or modified by applying an independent film layer such as for example, through a spray application, film application, or by integrating a chemical characteristic into the material itself as an admixture, on a molecular level, or by applying material inside the mould cavity or thermoforming equipment that can be used to infuse a chemical, such as an antimicrobial agent, hydrophilic or hydrophobic agent, or the like, into the material during forming.

A layer of material 311 may be applied on the surface 307 such as by spraying or the like, as shown in view 308, may be embedded within the surface 307 for example in a molecular infusion, as shown in view 309, or can be applied as a separate integrated film layer on the surface 307 as shown in view 310. Various modifications will be apparent to those skilled in the art. For example, instead of a spray application, an agent may be mixed into the resin that is used in the injection moulding process of the electronic apparatus 300. Alternatively, the surface characteristic can be associated with a material characteristic of the independent film layer.

The above described functional surface layer can further include an anti-fingerprint property, an oleophobic property or the like, through surface modification. By treating the surface 307 of the electronic apparatus 300, such as by applying an oleophobic chemical, additional properties can be realized. For example, a coating can be used to create a hard surface on the electronic apparatus 300 thus increasing resistance to wear, scratches, and the like.

In some examples, as described, the surface 307 of the electronic apparatus 300 can be coated with a layer of antimicrobial agent. An agent, such as a silver based agent, a zinc pyrithione based agent, or the like can be applied so as to kill microbes, fungus, bacteria, or the like, greatly reducing the risk of cross contamination or infections for articles that are handled by multiple users. An antimicrobial effect can be achieved on the surface on the electronic apparatus 300 by mixing the antimicrobial agent into the resin used in the injection moulding process or a direct spray on surface 307 of the electronic apparatus 300 or earlier in the manufacturing process by integrating the agent into film substrate and the like. The surface can be further treated for easy cleaning by coating the surface 307 with a layer of hydrophobic materials like fluorine chemistry or aliphatic urethane or the like. Hydrophobic surface characteristics cause water to easily roll off the surface of the article and by doing so carries away the dirt and other contaminant from the apparatus 300 surface.

Figure 4:
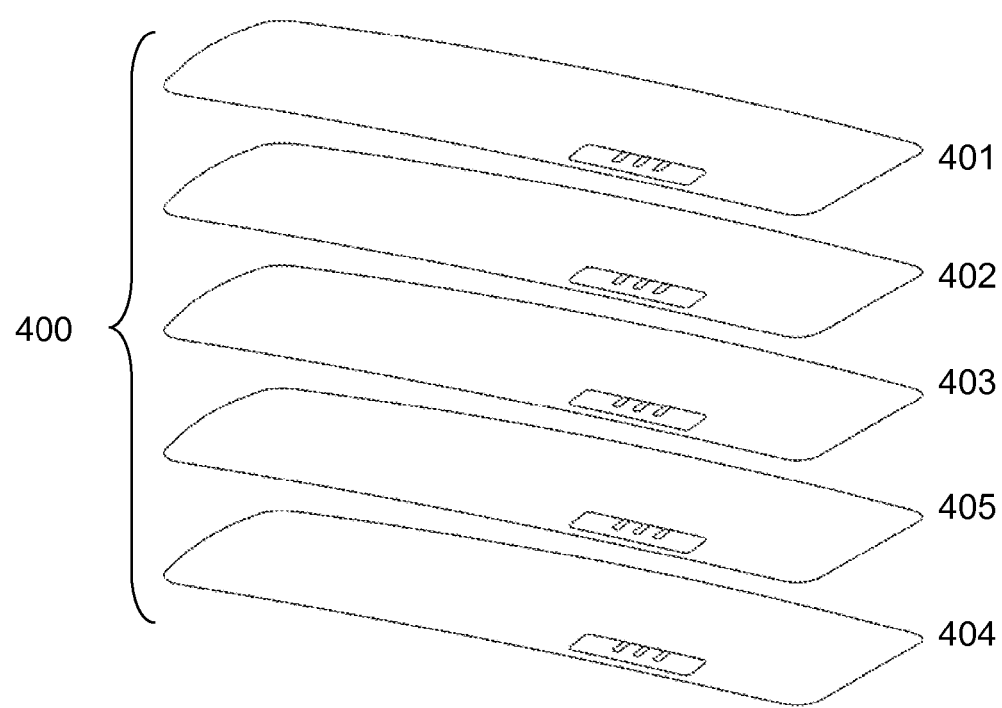
FIG. 4 is an exploded view of an electroluminescent layer.

Different layers can be incorporated into a film substrate that can be formed and moulded. Various layers such as those enumerated in FIG. 4, which show a lighting layer 400, can be formed into a 3-dimensional shape to be used in manufacturing of electronic products as described herein. The lighting layer 400 can be printable with lighting elements, such as AC electroluminescent, DC electroluminescent, organic LED and the like.

An exemplary lighting layer 400 using AC electroluminescent (EL); the lighting functional layer can be configured a transparent conductive ink 401, a phosphor ink layer 402, three layers and above of dielectric ink layer 403, a second conductive ink layer 404, and transparent primer ink 405. The phosphor ink layer 402 is sandwiched between the conductive ink layer 401 and the dielectric ink layer 403 which acting as an electrodes cause the phosphor ink layer 402 to release light when an alternative current is applied. The phosphorous ink layer 402 can be printed with any phosphor material like zinc sulphide or the like, that will release light when an electrical current is applied. The dielectric layer 403 is printed with any dielectric ink that is compatible with EL application. The silver conductive ink layer 404 acts as the second or back electrode for the EL layer used for the conducting of electricity. A transparent primer is printed over the silver conductive ink layer to protect the silver circuitry during injection moulding and handling.

An exemplary touch sensor layer can be further configured with electrodes and traces printed using conductive inks, such as silver conductive ink, PEDOT conductive ink, and the like. The conductive electrodes so formed, can act as a sensing zone whereby, for example, as in the case of capacitive touch sensor, an electric field can be applied there across that will experience a charge capacitance change when a finger for example is placed in the range of the electric field or in direct contact with the sensing zone. The change in electric field will then be detected and interpreted by a micro-processor.

The high transmissivity of the transparent conductive ink layer will allow light from the lighting layer to pass through the plastic films and provide a visible indication to a user, while the various insulation layers separate the functional layers and prevent any short circuits between differently charged layers. It will be appreciated that the grounding layer is printed with a transparent conductive ink that will not impair the transmissivity of light produced by the lighting layer and yet shield the electrical field generated by the lighting layer so as to prevent electric field interference being induced into the capacitive sensing zone.

Figure 5:
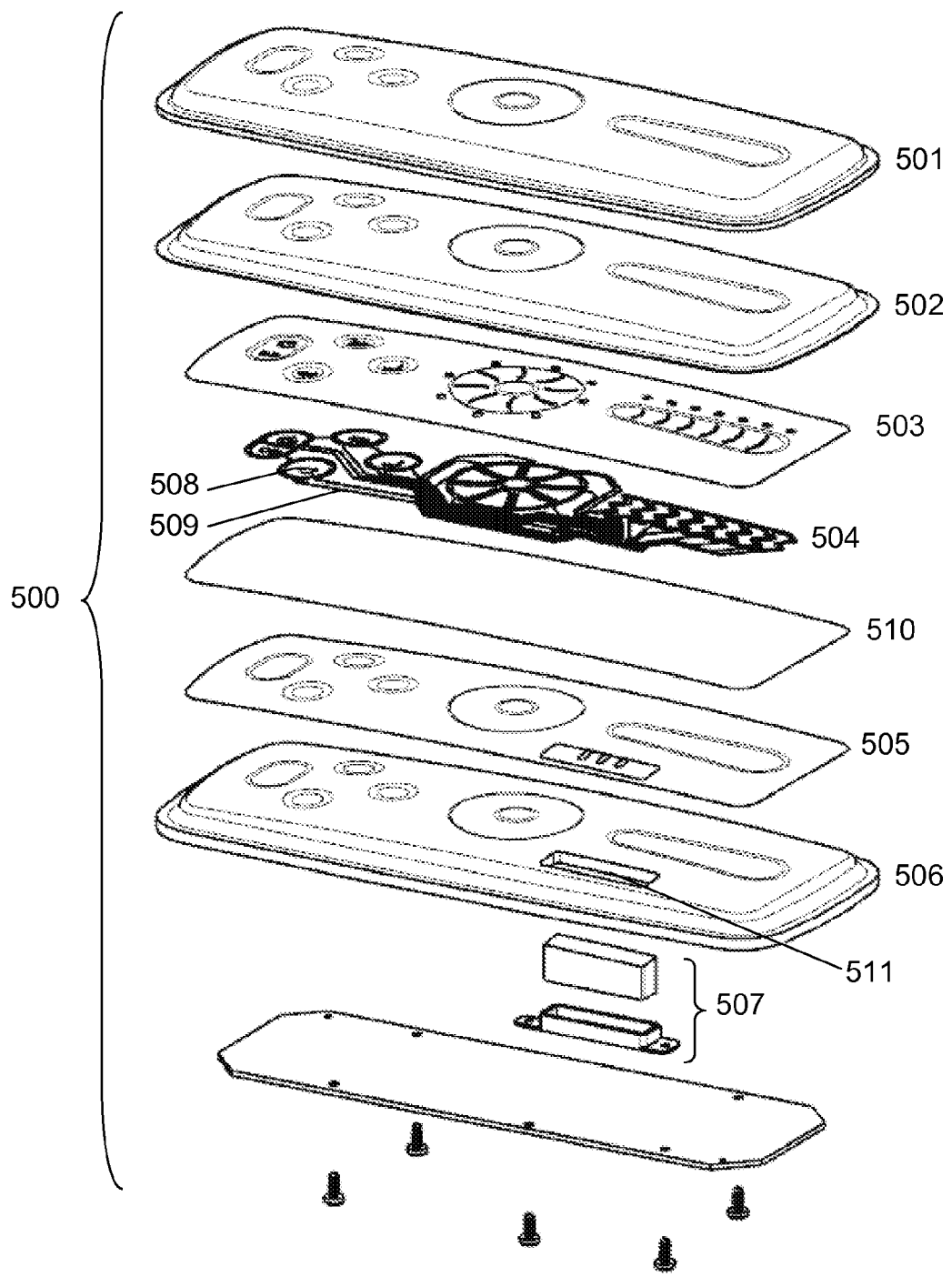
FIG. 5 is an exploded view of an electronic apparatus in accordance with one or more embodiments.

FIG. 5 illustrates an electronic apparatus 500 according to an embodiment. The electronic apparatus 500 comprises of a Film-Insert-Moulding Technology (FIM) part and a connector assembly 507. The FIM part includes a transparent moulded plastic section 501, a film 502, a decorative layer 503, a touch sensor layer 504, a grounding layer 510, a lighting layer 505 and an over-moulded thermoplastic 506. The connector assembly 507 can be configured to connect the touch sensor layer 504 to an external driver or a controller that is accessible through a physical platform such as a printed circuit board or the like, which can also accommodate other components such as a power inverter for providing power to an lighting layer 505 or the like.

The transparent moulded plastic section 501 includes a layer of moulded plastic, which in accordance with embodiments, can be provided, for example, with a thickness of less than 5 mm over the film 502. The film 502 can be made of a plastic material including polycarbonate (PC), polyethylene terephthalate (PET), or any thermoplastic material that can withstand the processing parameters in some manufacturing processes that includes injection moulding, thermoforming, high pressure forming, hydroforming, and insert moulding processes. The processing parameters can include pressure, temperature, and cycle time.

The film 502 also acts as a substrate for the printing of decorative inks and functional inks or pastes such as conductive paste, conductive inks, lighting inks or the like, which can be used to form the decorative layer 503. The decorative layer 503 consists of a plurality of decorative ink layers. The functional inks can be printed on either side of the film 502. The touch sensor layer 504 can include electrodes 508 and traces 509 printed using conductive inks to form capacitive switches.

The grounding layer 510 is printed with a transparent conductive and isolative ink that will not impair the transmissivity of light produced by the lighting layer and yet will shield the electric field generated by energizing the lighting layer so as to prevent interference from being induced into the capacitive sensing zone.

The lighting layer 505 can be made up of different functional layers: transparent conductive ink Layer, lighting element Layer, silver conductive ink layer The touch sensor layer 504 is the front electrode for the electronic apparatus 500. The high transmissivity of the touch sensor layer 504 allows light from the lighting layer 505 to be readily visible to a viewer. The printed lighting layer will release light when an electrical current is applied.

The thermoplastic moulding 506 is a layer of plastic that provides structural strength to the FIM part. The thermoplastic moulding 506 has openings 511 for the traces 509 to come out. The substrate has a front surface and a back surface, either the front surface or the back surface can be printed with layers of decorative inks and cured to produce the designed graphic. Conductive ink can be printed over the graphic layer to produce the capacitive sensing zone. Layers of dielectric can be printed over the capacitive sensing zone and a layer of lighting material printed over the dielectric layer. The lighting layer along with the other layers where appropriate can be cured to create a light source to illuminate the region of the film switches or other area that required backlighting. The functionalized film can then be die cut and formed into the desired shape via high pressure forming, blow forming, and the like, and injection moulded to produce the final product. After which a connector such as a tail connector, zebra connector or the like, can be attached.

Figure 6:
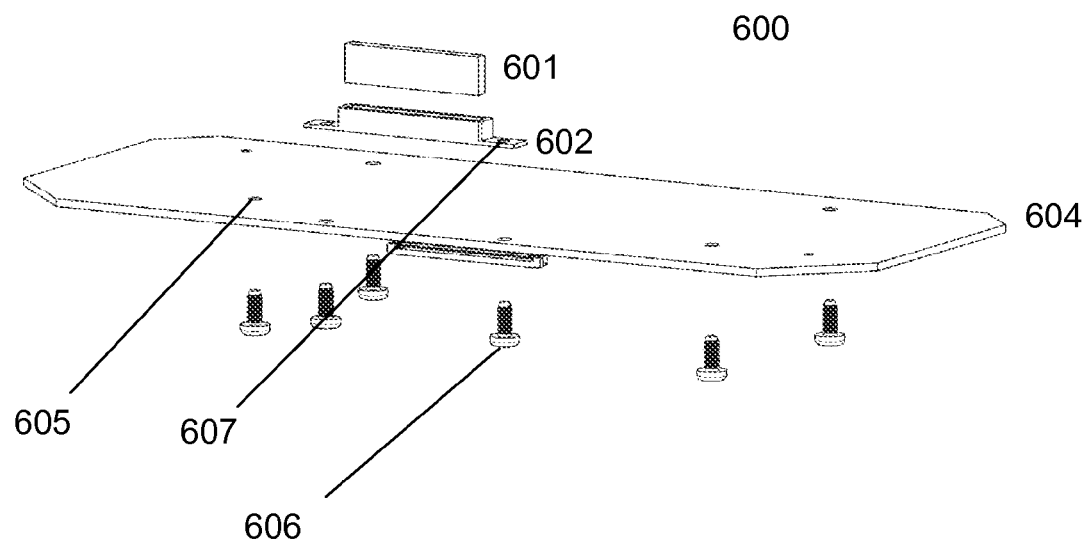
FIG. 6 is an exploded view of a connector assembly.

FIG. 6 is an exploded view of a connector assembly 600 according to an embodiment. The connector assembly 600 has a connector 601, a connector holder 602, a printed circuit board (PCB) 604. Connector 601 can be a zebra connector or the like. The connector holder 602 has a pair of plate holes 607, each plate hole 607 for receiving a screw 606. The printed circuit board 604 has four PCB holes 605, each PCB hole 605 for receiving a screw 606.

In an embodiment, conductive traces are formed by the conductive inks during printing. These conductive traces can be connected to outer mating connection points. A cavity 511 can be created in the thermoplastic moulding 506 to fit a connector 601, such as a zebra connector so as to connect conductive traces with external connecting points. A series of conductive fingers can be printed on the film 502 can then be connected to a printed circuit board 604. The PCB will then fasten to the FIM part using a conventional fastening method such as by a screw 606.

Figure 7A:
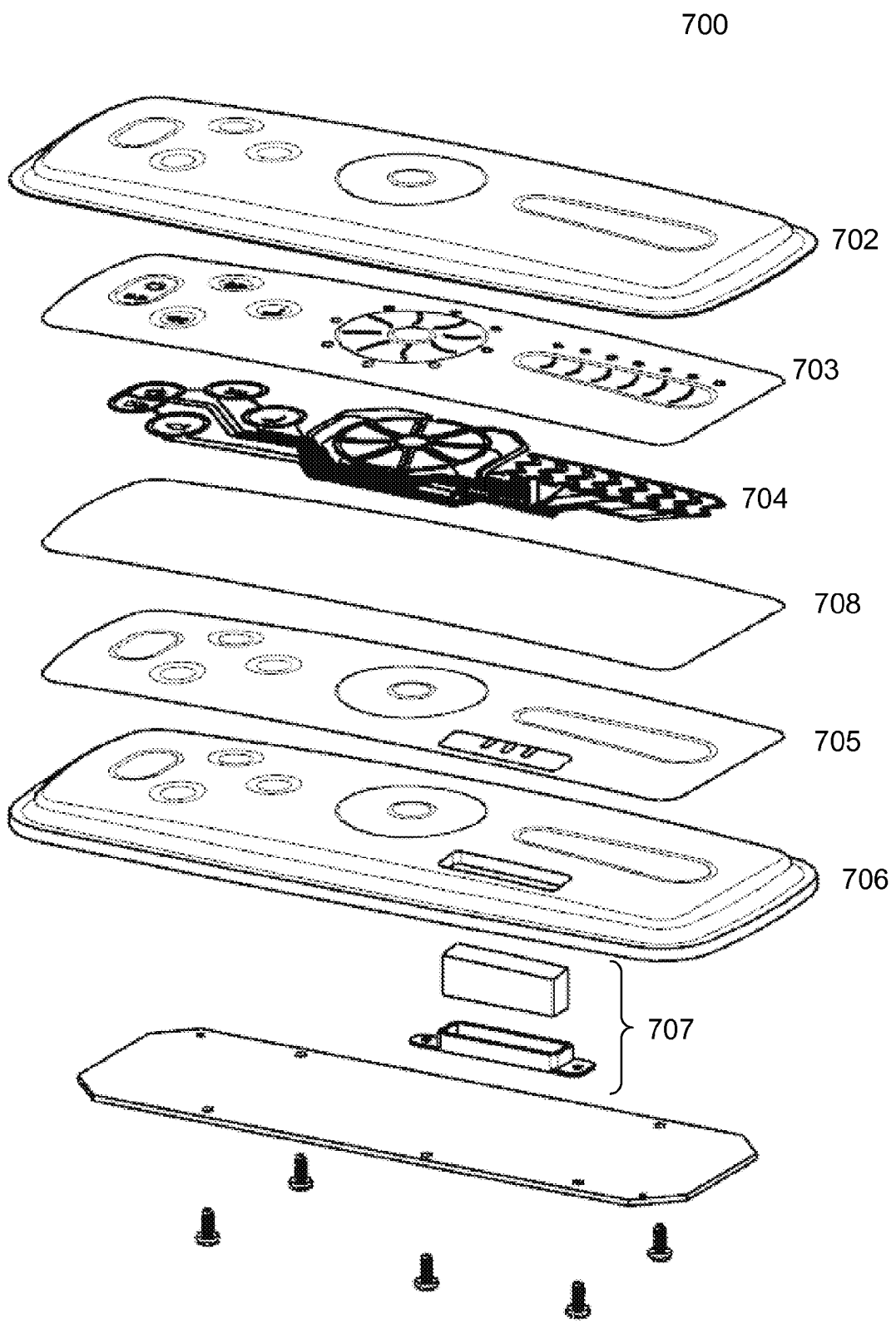
FIG. 7A is an exploded view of an electronic apparatus in accordance with one or more embodiments including a lighting layer and a touch sensor layer.

FIG. 7A shows an electronic apparatus 700 according to an embodiment. The electronic apparatus 700 can have six sections including a film 702, a decorative layer 703, a touch sensor layer 704, a grounding layer 708, a lighting layer 705 to form a lighting area, a moulded plastic 706, and a connector assembly 707 configured to connect to a external driver or controller mounted on a circuit platform such as a printed circuit board (PCB), which can be provided with a power inverter or the like.

Figure 7B:
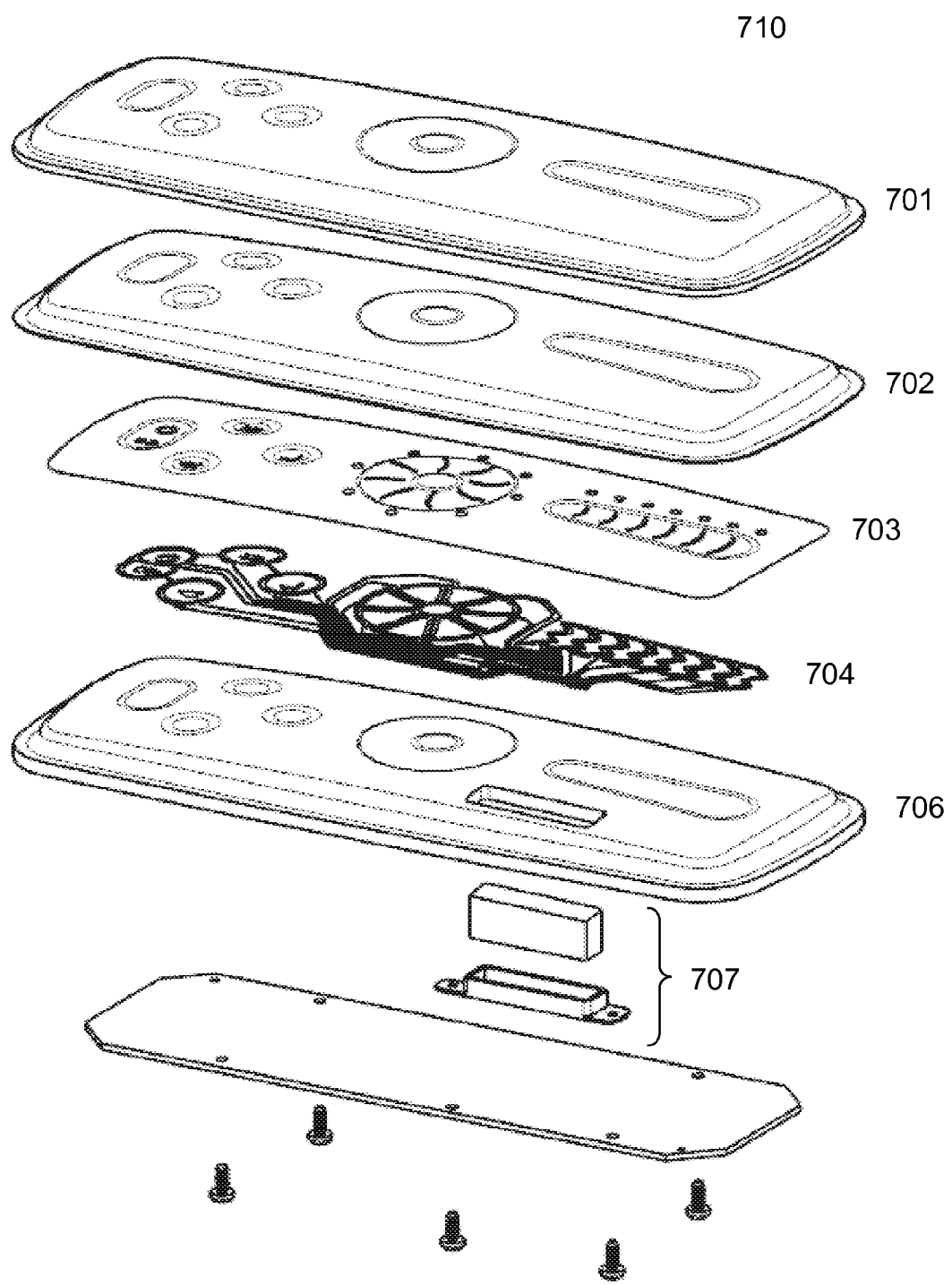
FIG. 7B is an exploded view of an electronic apparatus in accordance with one or more embodiments including a touch sensor layer.

FIG. 7B shows an electronic apparatus 710 according to an embodiment. The electronic apparatus 710 has a transparent moulded plastic section 701, a film 702, a decorative layer 703, a touch sensor layer 704, a moulded plastic 706, and a connector assembly 707. Notably absent in electronic apparatus 710 is a lighting layer 705. A backlighting function can still be provided in the electronic apparatus 710 using an external light source (not shown) such as light emitting diodes (LEDs), fluorescence lighting, CCFL, or the like, as would be appreciated by one of ordinary skill in the art.

Figure 7C:
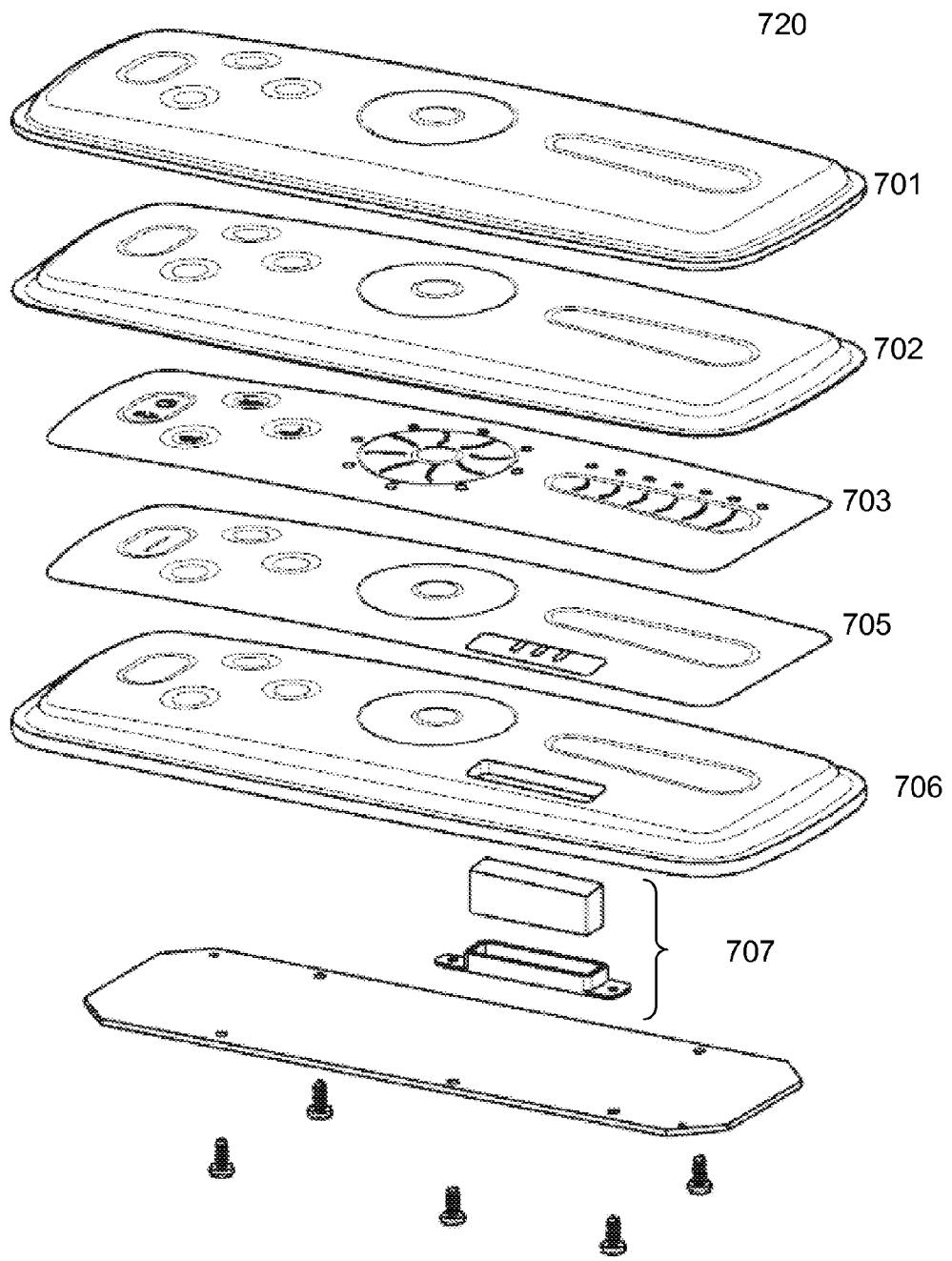
FIG. 7C is an exploded view of an electronic apparatus in accordance with one or more embodiments including a lighting layer.

FIG. 7C shows another electronic apparatus 720 according to an embodiment. The electronic apparatus 720 has a transparent moulded plastic section 701, a film 702, a decorative layer 703, lighting layer 705, a moulded plastic 706, and a connector assembly 707. Notably absent in electronic apparatus 720 is a touch sensor layer 704. Instead, an input function may be achieved through use of a mechanical switch, haptic input device, or the like. However, it will be noted that in accordance with embodiments, the lighting layer 705 can still be contoured as described herein and used as a backlighting source for the mechanical switches or buttons.

The interconnection system consists of the cable and connector on both ends. A conductive ink circuit (CIC) is the most straight forward method since the film is a printed circuit, this is the extension of the circuit like a "Pig Tail". The end of the "Pig Tail" may require printing with carbon ink to protect the ink surface for abrasion and molecular migration.

This method can be applied to both regular and reverse FIM design. However, the effectiveness of the design depends on the flexibility of the "Pig Tail" and it is proportional to the thickness of the film used. The "Pig Tail" needs to be designed based on the product system design so that the product system can meet environment validation tests.

Alternatively, a Flat Flexible Cable (FFC) or Flexible Printed Circuit (FPC) can be used to bridge between film and board. The connectors bridging between the film and the FFC or FPC can be a Zebra connector or ACF (Anisotropic Conductive Film adhesives). ACF may include two types, the Pressure Sensitive Adhesive (PSA) or thermoplastic adhesive.

The connection between pig tail/CIC, FFC, FPC and the PCB may require a low insertion or zero insertion force (LIF or ZIF) connector soldered or bonded on the PCB. The Flat Flexible Cable may alternatively be directly soldered to the PCB. A mechanical pin or connector receptacle can be crimped directly to the CIC and FPC so that the end of CIC and FPC can be directly soldered to the PCB or plugged into the header on the PCB.

The interconnect design also includes the location of the terminal to connect to the PCB. There are three locations, directly behind the film that can serve this purpose. The detail of the locations and methods of connection are shown in FIG. 8 to FIG. 39 and will now be described in more detail.

Figure 8:
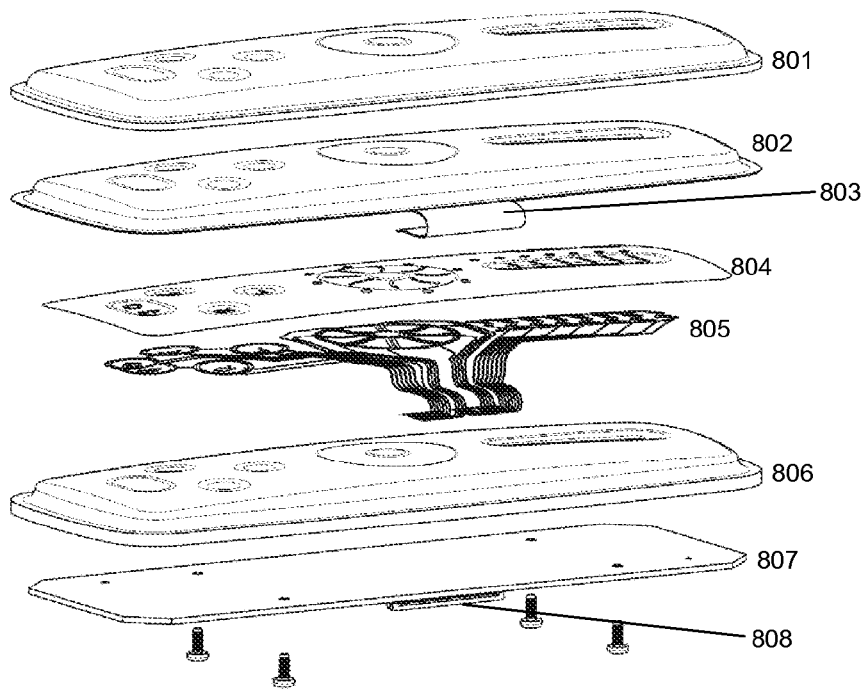
FIGS. 8-10 are exploded views and a part cut-out view of the pig tail interconnect.
Figure 9:
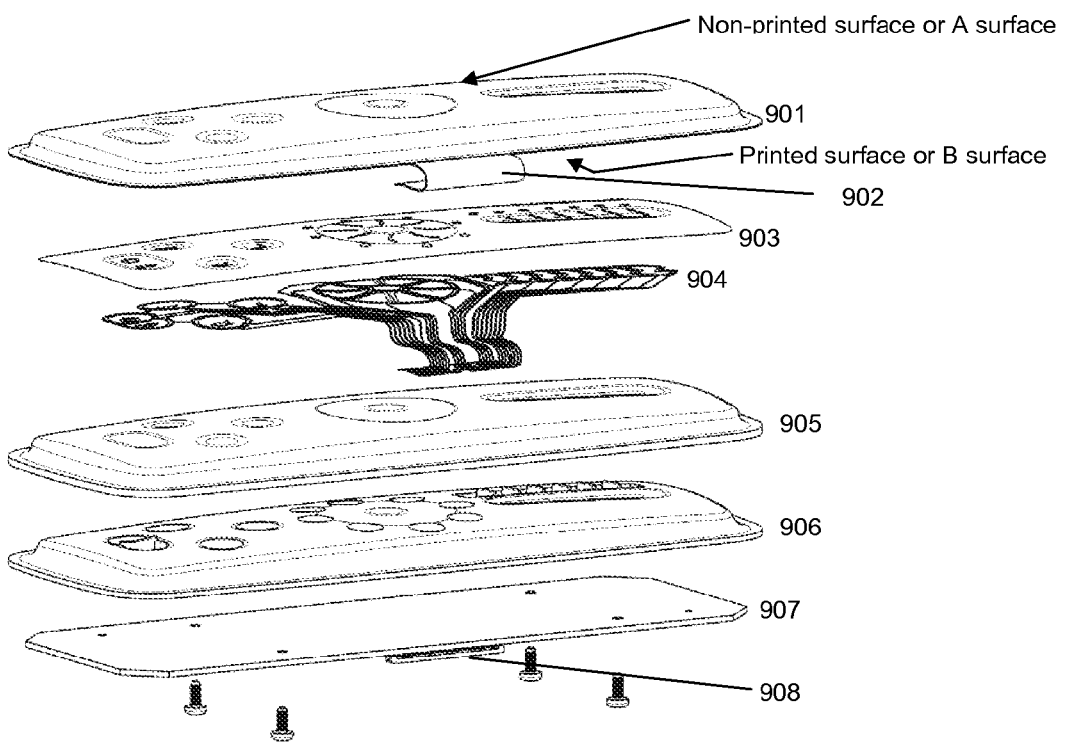

FIG. 8 shows the "Pig Tail" with a front injection moulding design. A formed film 802 with decorative 804 and functional 805 ink printing on the top appearance surface (non-printed surface or A surface) and subsequently injection moulded with an opaque plastic 806 on the printed side (B-surface) of the film. This opaque plastic 806 serves as a structure for PCB 807 mounting as well as the light blocker 1006 in FIG. 10 when an external light source 1007 in FIG. 10 backlights a graphic printed on the decorative layer 804.

The "Pig Tail" 803 is the extended part from the film substrate 802, which is printed with conductive traces 805. The extended portion of the film serve as the connection or bridging the printed sensing switch circuit 805 to the PCB 807 when the free end engages to the connector 808, either ZIF or LIF. The connector 808 is soldered on the PCB 807. It may also be mechanically mounted on the PCB 807.

Alternatively, the transparent plastic 905 can be moulded at the printing side of the film and followed by the 2nd moulding 906 which is the opaque plastic over the transparent plastic 905. The "Pig Tail" 902 bridges the printed switch circuit 904 and the PCB 907 through connectors 908 soldered on the PCB 907. This configuration is show in FIG. 9.

Figure 10:
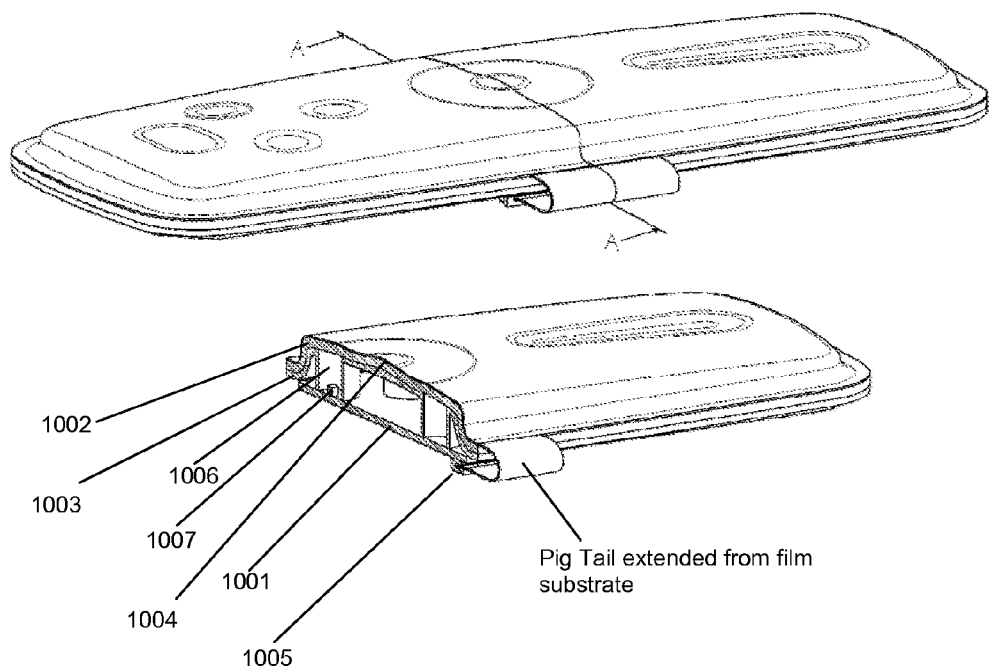

A complete interconnection system using the pig tail is shown in FIG. 10. Transparent plastic 1002 is injection moulded at the printed surface of the printed film substrate 1004. A second plastic moulding 1003 which is opaque and serves as a light blocker 1006 for an LED 1007.

Figure 11:
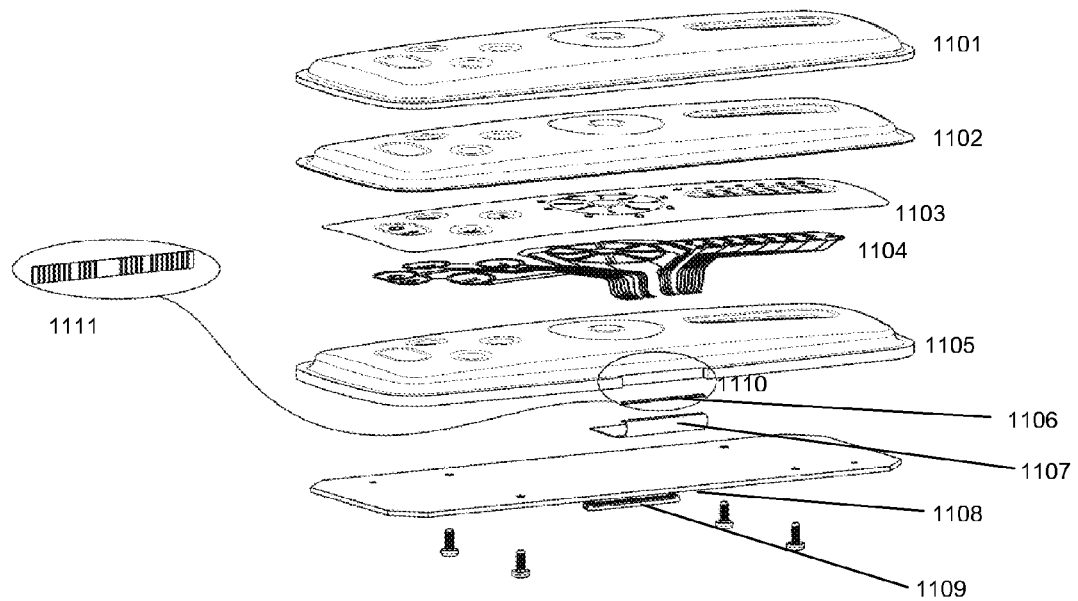
FIGS. 11-14 are exploded views and part cut-out views of the ACF on side wall, parallel to (Close to) appearance surface interconnect.
Figure 12:
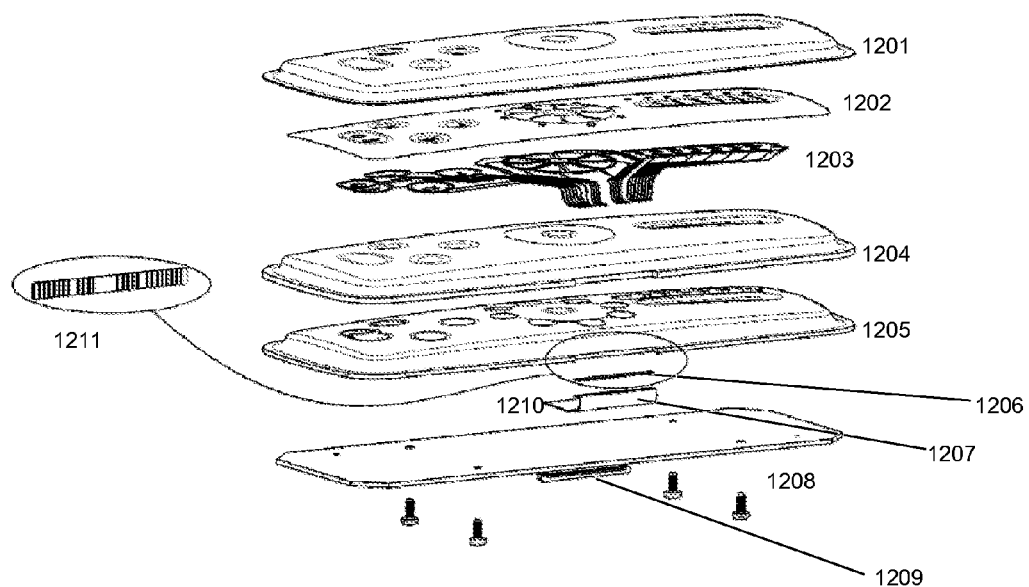

An application of ACF is shown in FIG. 11. A formed film substrate 1102 with decorative 1103 and functional 1104 ink layers has a transparent plastic injection moulding 1101 on the top appearance surface (non-printing surface or A-surface) and is subsequently moulded with an opaque plastic 1105 on the printing side (B-surface) of the film. This opaque plastic 1105 serves as a structure for PCB 1108 mounting as well as a light blocker 1306 in FIG. 13 when an external light source (1307 shown in FIG. 13) is being utilized to provide backlighting for graphics printed on the decorative layer 1103. The printed conductive traces 1104 are partially exposed at the flange 1110. The exposed portion of the film's printed conductive traces 1111 serve as the terminal end. A flexible printed circuit 1107 or flexible cable is attached to the terminal end through ACF 1106, the other end of the flexible printed circuit or flexible cable will engage to the connector 1109 such as ZIF, LIF soldered on the PCB 1108.

Alternatively, the transparent plastic 1204 can also be moulded at the printing side of the film and followed by the 2nd moulding 1205 which is the opaque plastic over the transparent plastic. The exposed portion 1210 of the film's printed conductive traces 1211 serve as the terminal end of the part. A flexible printed circuit 1207 or flexible cable attaches to the terminal end through ACF 1206, either PSA or thermoplastic adhesive; on one end. The other end will engage to the connector 1209, such as ZIF, LIF soldered on the PCB 1208. This configuration is show in FIG. 12.

Figure 13:
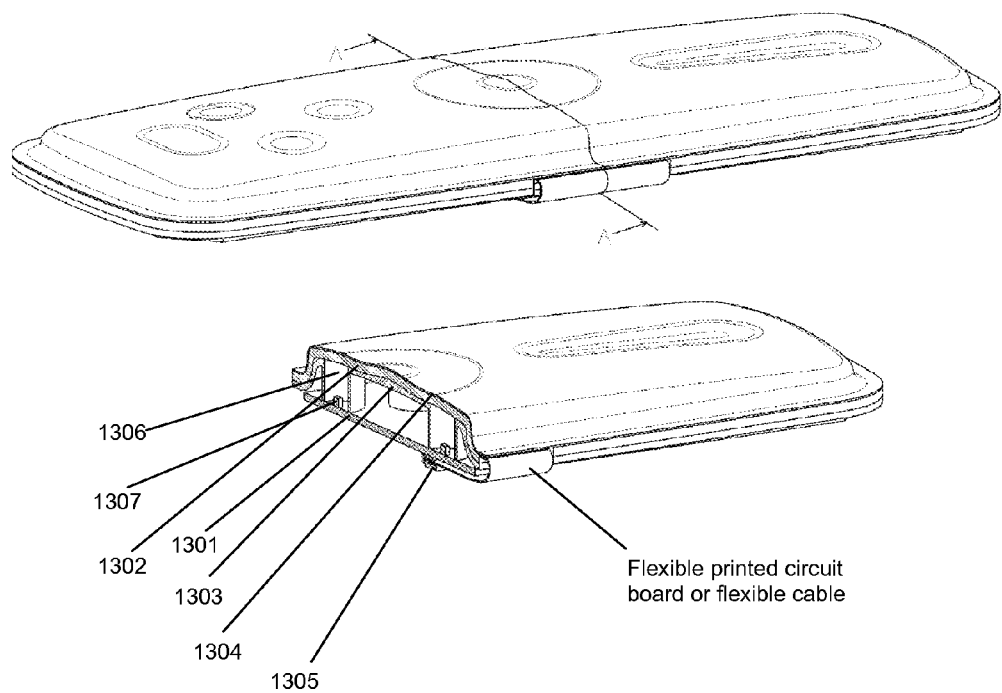
Figure 14:
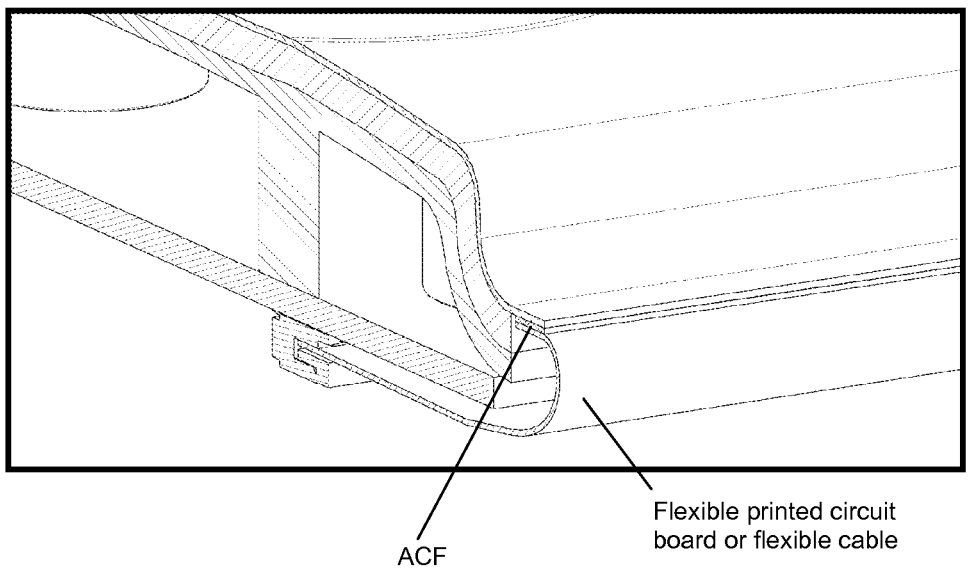

A complete interconnection system using ACF on side wall, parallel to (close to) appearance surface is shown in FIGS. 13 & 14. Transparent plastic 1302 is injection moulded at the printed surface of the printed film substrate 1304. A second plastic moulding 1303 which is opaque and serves as a light blocker 1306 for light source LED 1307. FIG. 14 shows the concept of ACF and FPC or FFC assembled together.

Figure 15:
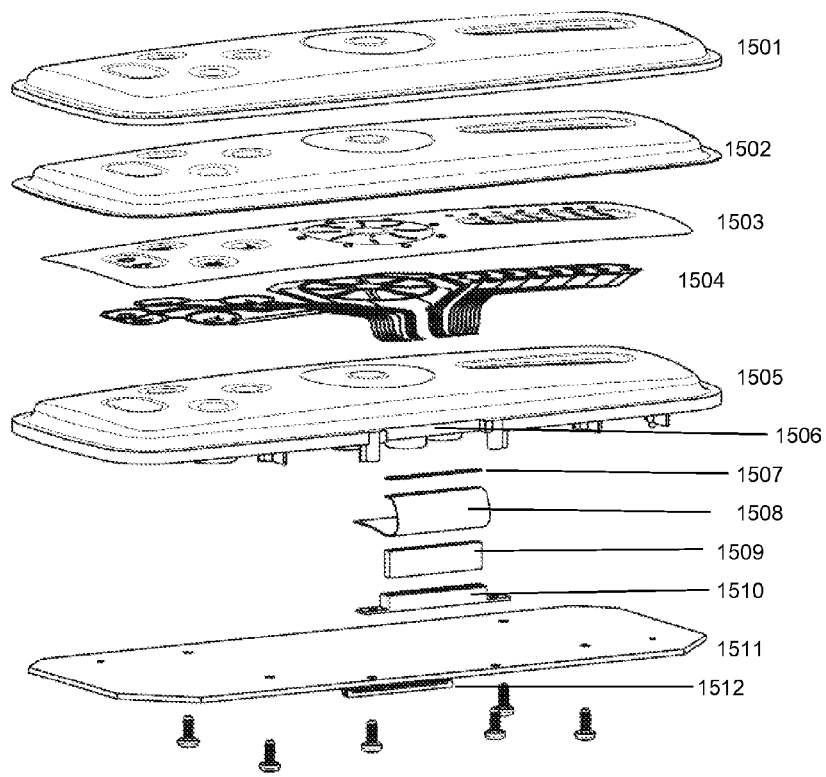
FIGS. 15-16 are an exploded view and part cut-out views of the ACF behind decorative surface with elastomeric fastening.

FIG. 15 shows the combination of ACF PSA application and elastomer connector application. A formed film substrate with decorative 1503 and functional 1504 ink layers has a transparent plastic injection moulding 1501 on the top appearance surface (non-printing surface or A-surface) and is subsequently moulded with an opaque plastic 1505 on the printing side (B-surface) of the film. This opaque plastic 1505 serves as a structure for PCB 1511 mounting as well as the light blocker (1601 shown in FIG. 16) when an external light source (1602 shown in FIG. 16) backlights the graphic printed on the decorative layer. In this assembly, the printed conductive traces are partially exposed at the flange of the part 1506. The exposed portion of the film's printed conductive trace 1504 serve as the terminal end. A flexible printed circuit 1508 or flexible cable attached to the terminal end through ACF on one end and the other end engage to the connector 1512, either ZIF or LIF, on the PCB 1511.

An elastomer spacer 1509 is placed on top of the FPC 1508 or FFC. This elastomer spacer 1509 provides a spring compression on the ACF with PSA 1507, i.e. enhancing the contact between the terminal end of the moulded part 1504 and the connection FPC or FFC 1508. The elastomer spacer 1509 can be constrained via a holder from the opaque plastic moulding 1505 or independent part 1510 attached to the opaque plastic moulding 1505. The other end of the FPC or FFC 1508 engages to the connector 1512 such as ZIF, LIF soldered or bonded on the PCB 1511.

Figure 16:
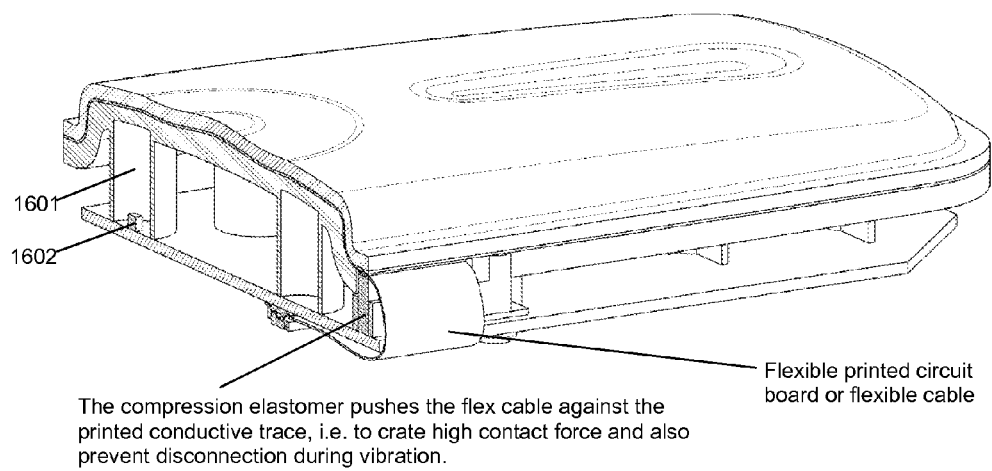

A complete interconnection system using the ACF on side wall, parallel to (Close to) appearance surface with Compression Load interconnect is shown in FIG. 16

Figure 17:
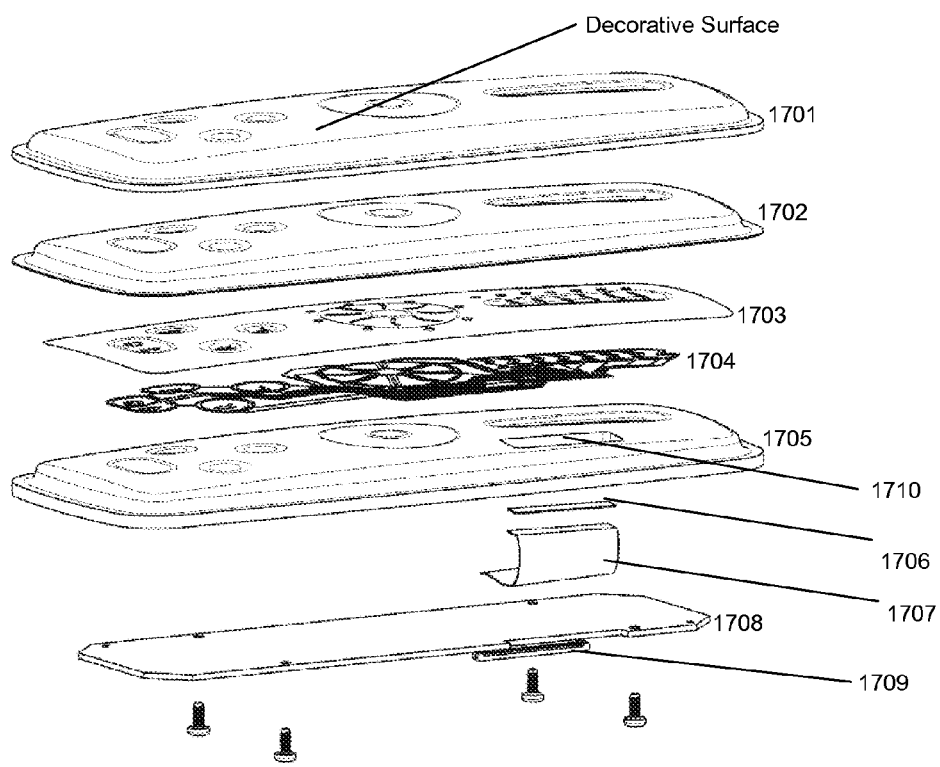
FIGS. 17-18 are an exploded view and a part cut-out view of the ACF behind decorative surface interconnect.

FIG. 17 shows another configuration of ACF application. A formed film substrate 1702 with decorative 1703 and functional 1704 ink layers has a transparent plastic injection moulding 1701 on the top appearance surface (non-printing surface or A-surface) and is subsequently moulded with an opaque plastic 1705 on the printing side (B-surface) of the film. This opaque plastic 1705 serves as a structure for PCB 1708 mounting as well as the light blocker 1801 for an external light source 1802 that backlights a graphic printed on the decorative layer. The printed conductive traces 1704 are partially exposed at the back of the decorative layer as show in 1710. The exposed portion of the film's printed conductive traces 1704 serve as the terminal end. A flexible printed circuit 1707 or flexible cable attach to the terminal end through ACF 1706, either PSA, thermoplastic adhesive; and the other end engages to the connector 1709, either ZIF, or LIF soldered on the PCB 1708.

Figure 18:
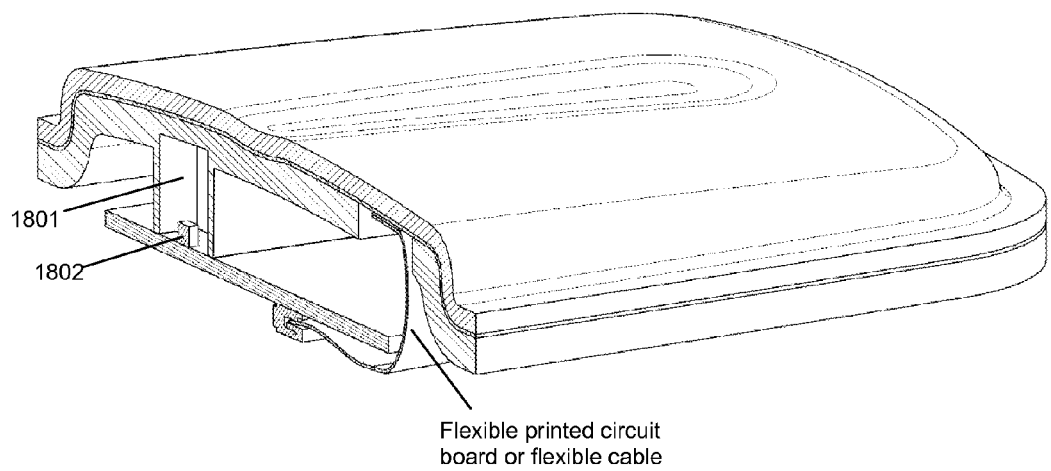

A complete interconnection system using the ACF behind decorative surface interconnect is shown in FIG. 18.

Figure 19:
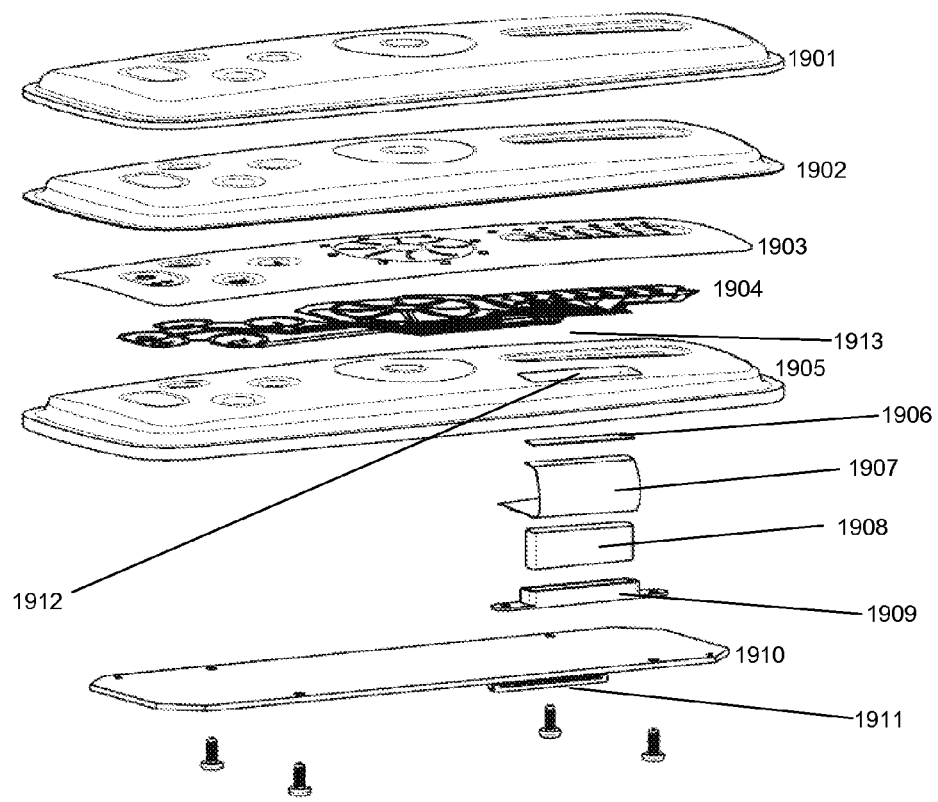
FIGS. 19-21 are an exploded view and a part cut-out view of the ACF behind decorative surface with elastomeric fastening.

FIG. 19 shows the combination of an ACF PSA application and elastomer connector application. A formed film 1902 with decorative 1903 and functional 1904 inks layers, has a transparent plastic injection moulding 1901 on the top appearance surface (non-printing surface or A-surface) and is subsequently moulded with an opaque plastic 1905 on the printing side of the film.

Figure 20:
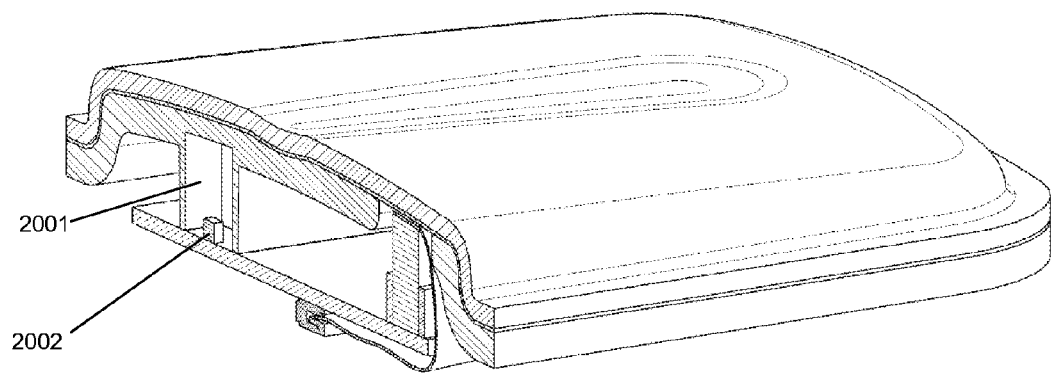

This opaque plastic 1905 serves as a structure for PCB 1910 mounting as well as a light blocker 2001 in FIG. 20 when an external light source (2002 shown in FIG. 20) backlights graphics printed in the decorative layer. The printed conductive traces 1913 are exposed with an opening 1912 at the back of the decorative layer. The exposed portion of the film's printed conductive trace 1913 serves as the terminal end. A flexible printed circuit 1907 or flexible cable attached to the terminal end through ACF PSA 1906, and the other end engage to the connector 1911, either ZIF or LIF, on the PCB 1910.

An elastomer spacer 1908 is placed on top of the FPC 1907 or FFC. This elastomer spacer 1908 provides a spring compression on the PSA 1906, i.e. enhancing the contact between the terminal end and the connection FPC 1907 or FFC. The elastomer spacer 1908 can be constrained via a holder on the opaque plastic moulding 1905 or an independent part 1909 attached to the opaque plastic moulding 1905. The other end of the FPC 1907 or FFC engages to the connector 1911 such as ZIF, LIF soldered or bonded on the PCB 1910.

Figure 21:
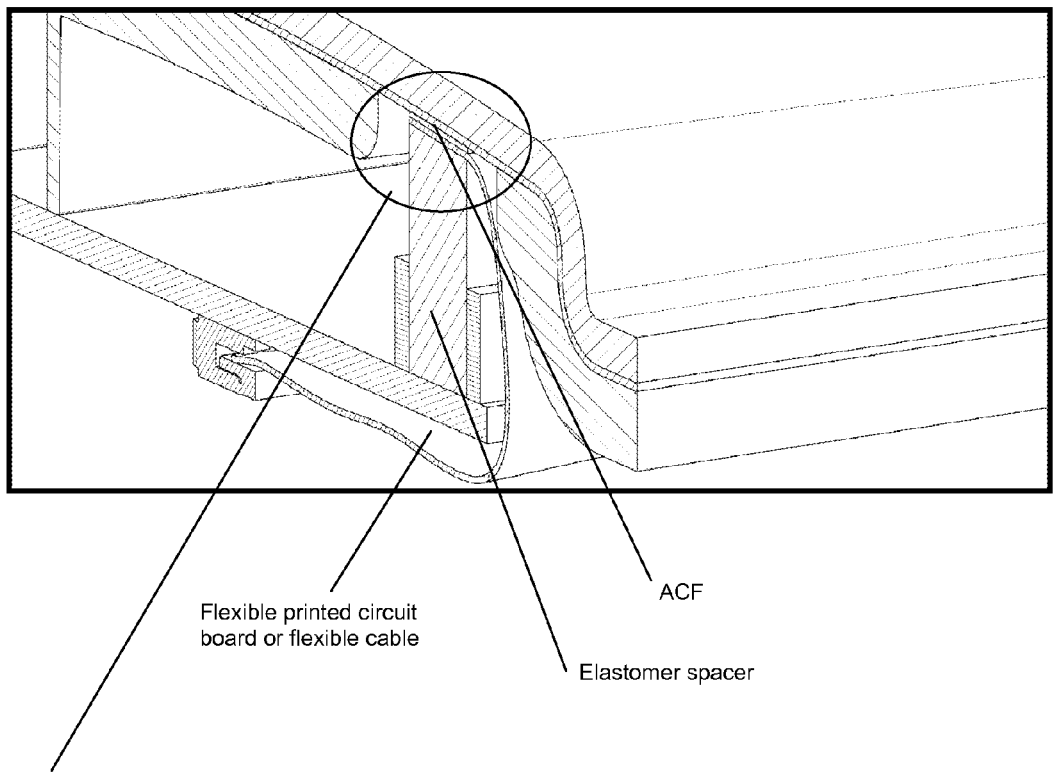

A complete interconnection system using the ACF behind decorative surface with elastomeric fastening interconnect is shown in FIGS. 20 and 21.

Figure 22:
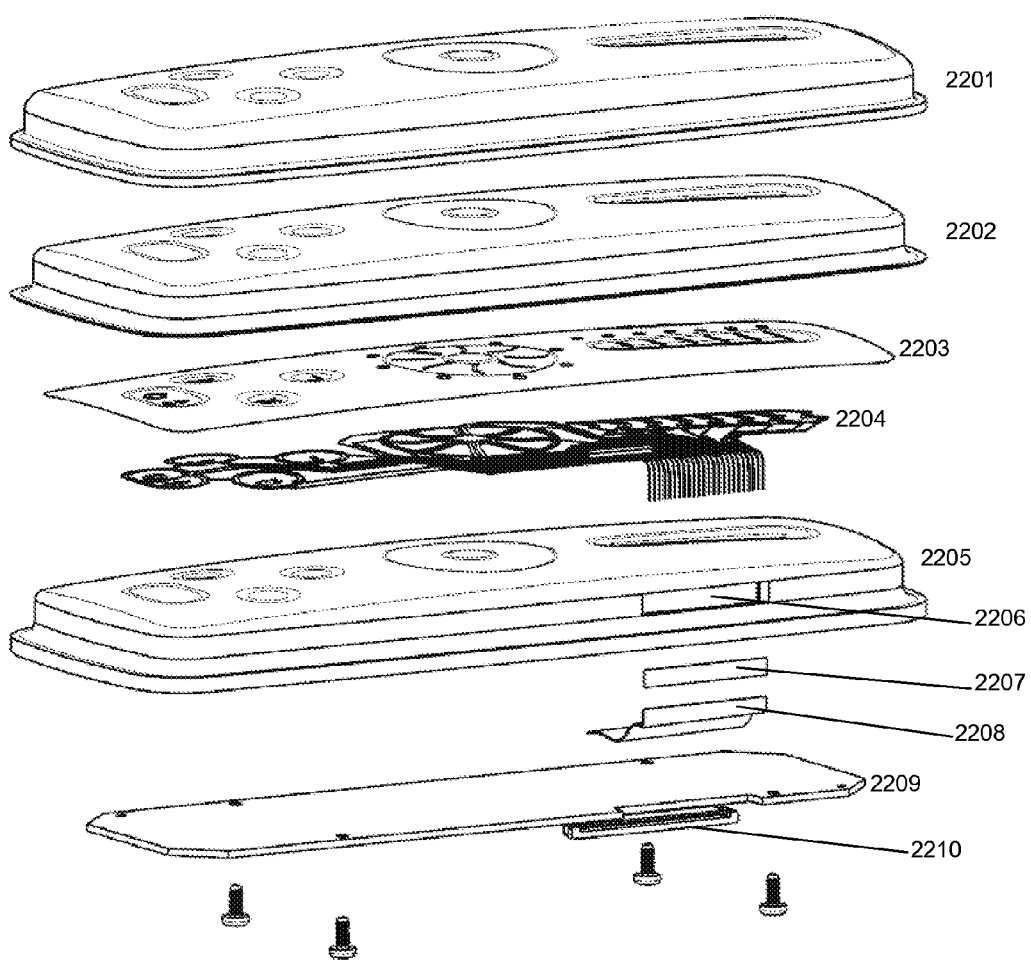
FIGS. 22-25 are exploded views and part cut-out views of the ACF on side wall, perpendicular (Close to) to appearance surface interconnect.
Figure 23:
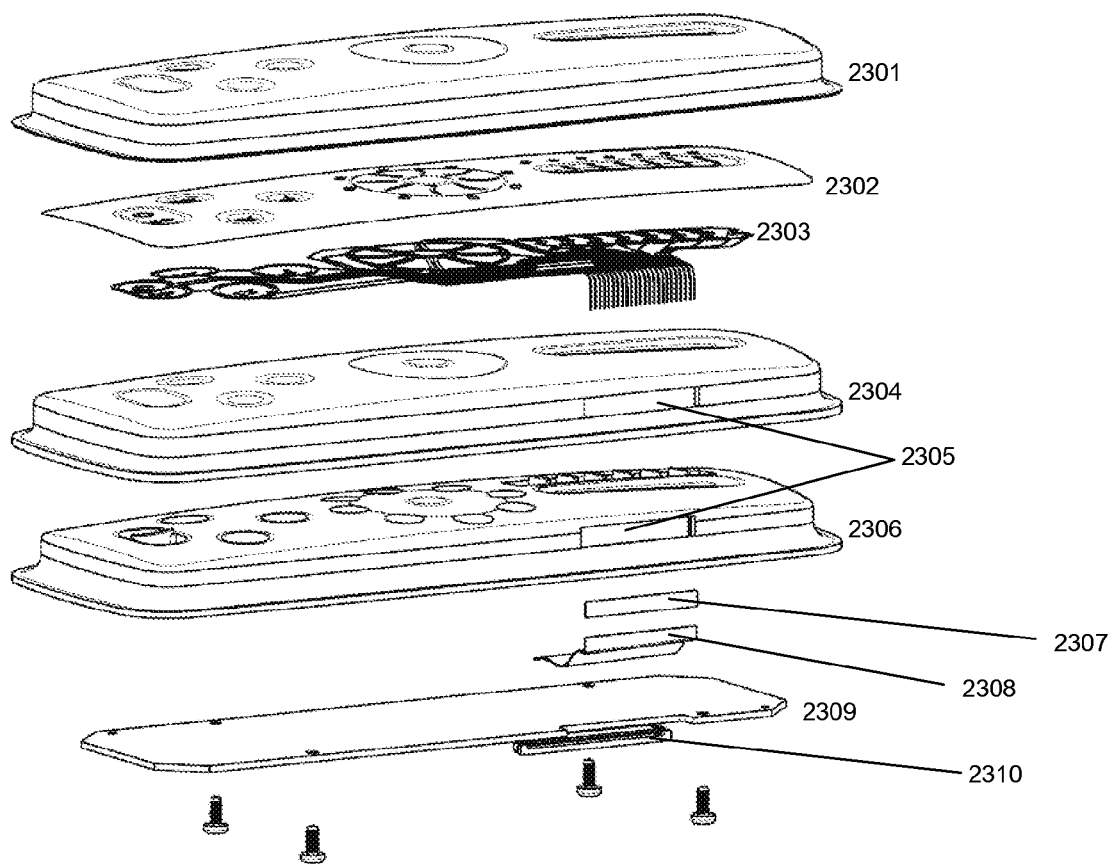

FIG. 22 shows another configuration of ACF application. A formed film substrate 2202 with decorative 2203 and functional 2204 ink layers has a transparent plastic injection moulding 2201 on the top appearance surface (non-printing surface or A-surface) and is subsequently moulded with an opaque plastic 2205 on the printing side of the film. This opaque plastic 2205 serves as a structure for PCB 2209 mounting as well as the light blocker 2401 in FIG. 24 when an external light source 2402 in FIG. 24 backlights a graphic printed on the decorative layer 2203. In this assembly, the circuit traces 2204 are partially exposed at the side wall 2206. The exposed portion of the film's printed conductive traces 2204 serves as the terminal end of the part. A flexible printed circuit 2208 or flexible cable attaches to the terminal end through ACF 2207, either PSA or thermoplastic adhesive; the other end engage to the connector 2210, either ZIF or LIF or the like, on the PCB 2209.

The transparent plastic 2304 on the appearance surface of the film can also be moulded at the printing side of the film and follow by the 2nd moulding which is the opaque plastic 2306. The exposed portion of the film's printed conductive trace 2303 serve as the terminal end of the part. A flexible printed circuit 2308 or flexible cable attached to the terminal end through ACF 2307, either PSA or thermoplastic adhesive; the other end engage to the connector 2310, either ZIF or LIF or the like, on the PCB 2309. This configuration is show in FIG. 23.

Figure 24:
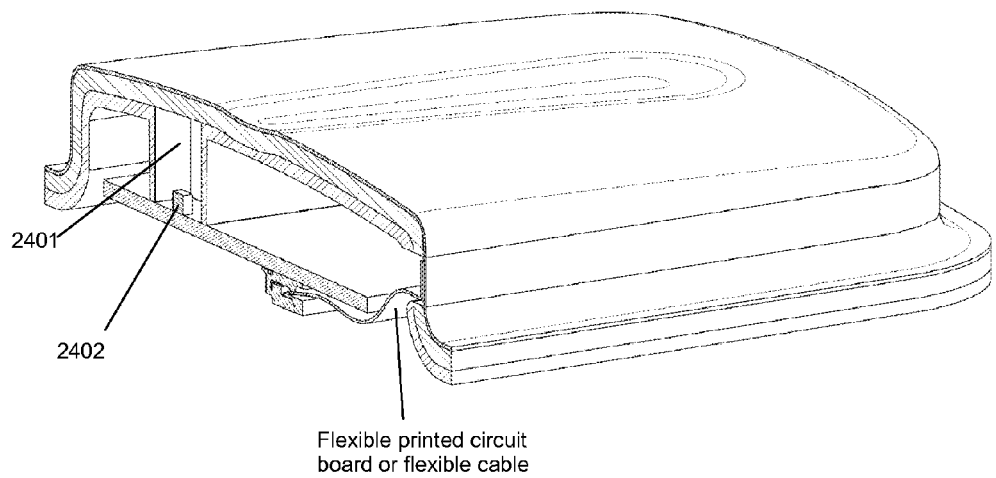
Figure 25:
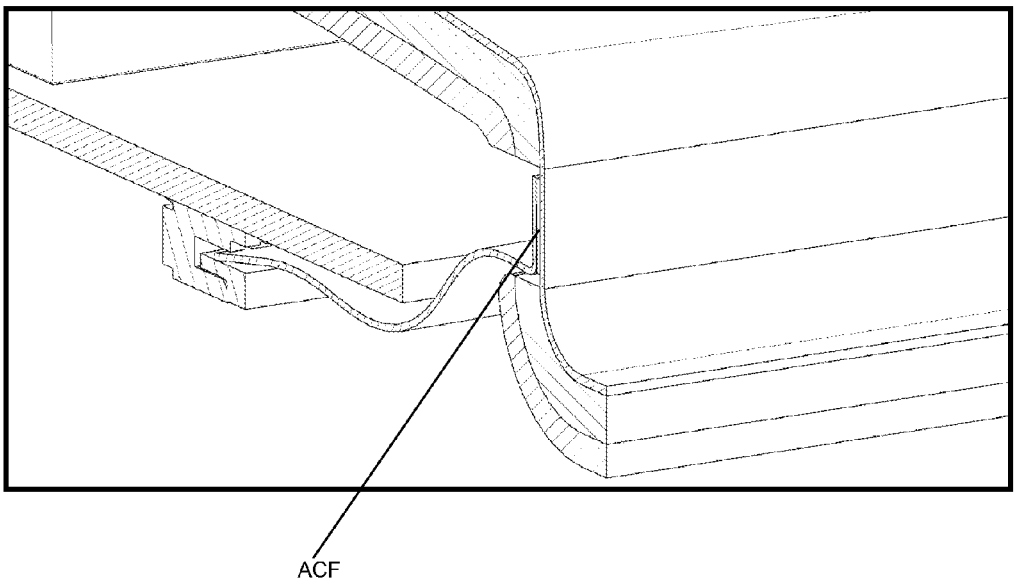

A complete interconnection system using the ACF on side wall, perpendicular (Close to) to appearance surface interconnect is shown in FIGS. 24 & 25.

Figure 26:
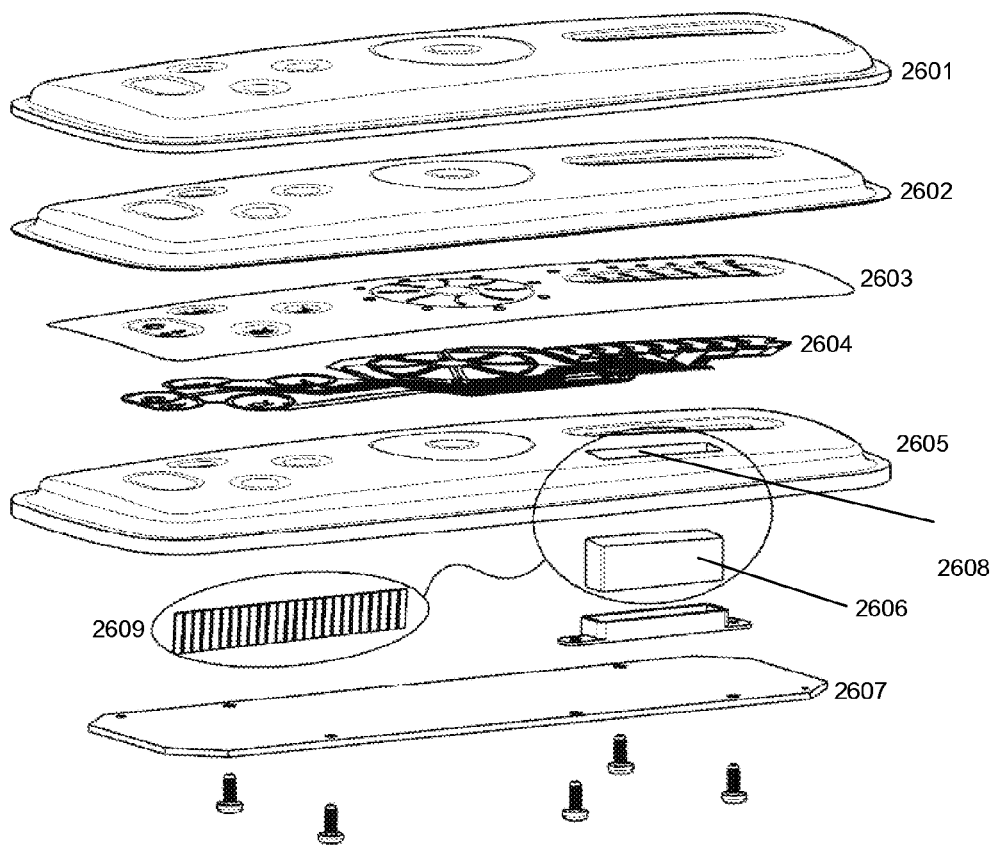
FIGS. 26-27 are an exploded view and a part cut-out view of the elastomeric connector behind decorative surface interconnect.

FIG. 26 shows an example of the elastomeric connector application. A formed film 2602 with decorative 2603 and functional 2604 ink layers has a transparent plastic injection moulding 2601 on the top appearance surface (non-printing surface or A-surface) and is subsequently moulded with an opaque plastic 2605 on the printing side (B-surface) of the film. This opaque plastic serves as a structure for PCB 2607 mounting as well as the light blocker 2701 in FIG. 27 for external light source 2702 in FIG. 27 backlights a graphic printed on the decorative layer. The printed conductive traces are partially exposed 2608 at the back of the decorative layer. The exposed portion of the film's printed conductive traces 2609 serve as the terminal end. An elastomeric connector 2606, such as Zebra connector, connects the printed conductive traces 2609 to the PCB 2607 traces. The elastomeric connector 2606 can be constrained via a holder on the opaque plastic moulding 2605 or an independent holder attaches to the opaque plastic moulding 2605 as shows in FIG. 26.

The Zebra connector 2606 is a zero insertion force connector that does not require soldering that provides a compliant surface-to-surface compression connector when deflected between opposing mirror-image pad patterns. Elastomeric connectors are composed of alternating layers of conductive and nonconductive silicone rubber. Silicone rubber is the base material because it has excellent aging properties, chemical stability, electrical reliability and superior performance in shock and vibration. It also provides a gasket-like seal to protect the contact surfaces.

The conductive layers consist of tiny conductive particles dispersed in silicone rubber. Within each of the conductive layers, the conductive particles create thousands of conductive paths. Therefore, each conductive layer provides multiple points of contact at the substrate interface. While the conductive layers ensures contact between mating pads, the nonconductive layers isolate the conductive layers from each another. These multiple layers coupled with the thousands of conductive paths ensure reliable electrical connection.

Figure 27:
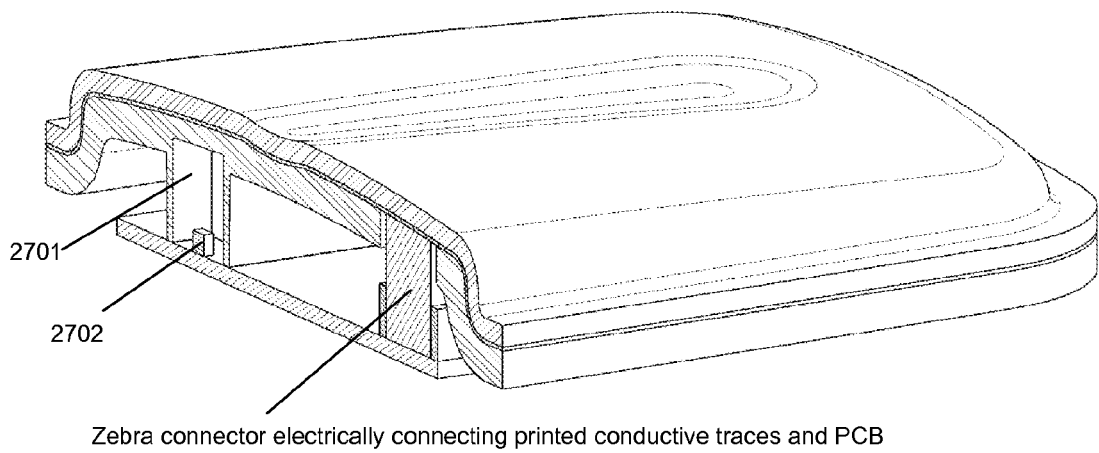

A complete interconnection system using the elastomeric connector behind decorative surface interconnects is shown in FIG. 27.

This method provides many options to locate a suitable area for interconnect. It has better mechanical stress control on connection area. Clamping force is controlled by screws.

Figure 28:
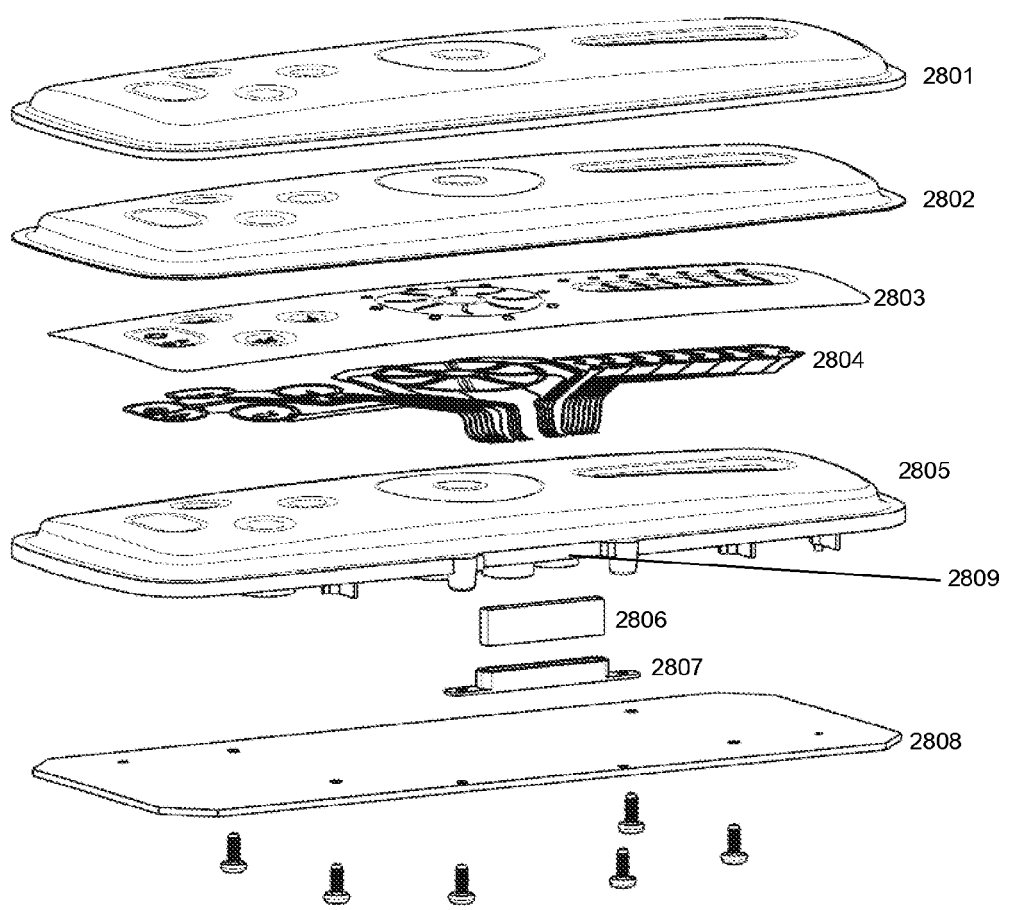
FIGS. 28-29 are an exploded view and a part cut-out view of the elastomeric connector on side wall, parallel to (Close to) appearance surface interconnect.

Another application of elastomeric connector is shown in FIG. 28. A formed film substrate with decorative 2803 and functional 2804 ink layers has a transparent plastic injection moulding 2801 on the top appearance surface (non-printing surface or A-surface) and is subsequently moulded with an opaque plastic 2805 on the printing side (B-surface) of the film. This opaque plastic 2805 serves as a structure for PCB 2808 mounting as well as the light blocker 2901 when an external light source 2902 backlights a graphic printed on the decorative layer. The circuit printed conductive traces 2804 are partially exposed at the flange part 2809. The exposed portion of the film's printed conductive traces serve as the terminal end. An elastomeric connector 2806, such as Zebra connector, will be used to connect the printed conductive traces 2804 to the PCB 2808 traces directly. The elastomeric connector 2806 can be constrained via a holder on the opaque plastic moulding 2805 or an independent holder 2807 attached to the opaque plastic moulding 2805.

Figure 29:
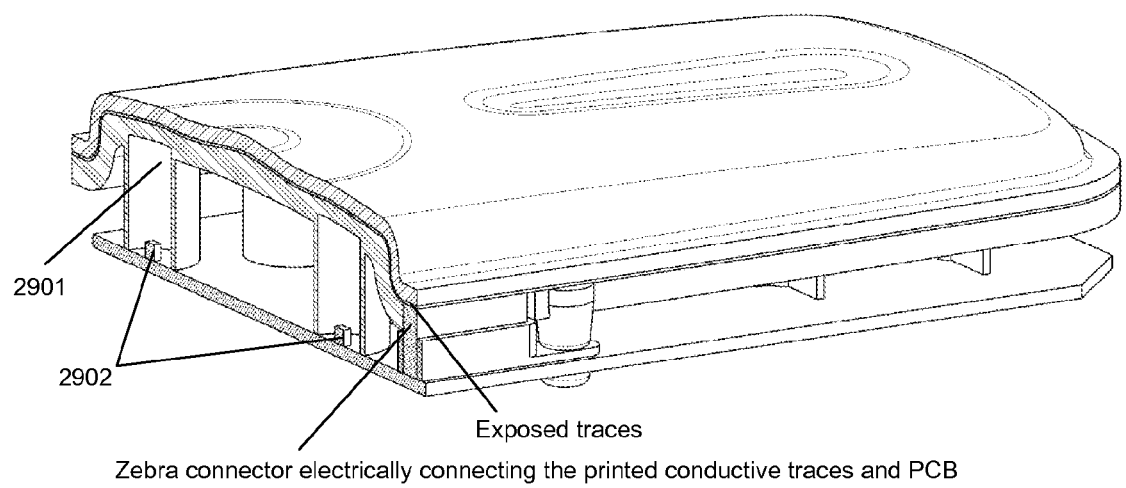

A complete interconnection system using the Elastomeric connector on side wall, parallel to (Close to) appearance surface interconnect is shown in FIG. 29.

This method provides many options to locate a suitable area for interconnect. It has better mechanical stress control on connection area. Clamping force is controlled by screws.

Haptic feedback takes advantage of our sense of touch by applying forces, vibrations, and/or motions to the user through a device.

Touch is the first sense to develop when we are born and the last sense used before death.

It is 20 times faster than vision.

No need of continuous user interaction with the device.

Humans are highly sensitive to vibrations up to 1000 Hz (most sensitive at 250 Hz).

The user can interact with the real environment and people around rather than the mobile device.

Haptic feedback can be used as an effective mode of communication using the vibration alarm with varying frequency and sensitivity. Haptics involves both proprioceptive and tactile senses, in concert with other senses, or the science of applying touch (tactile) sensation and control to interaction with electronics applications.

The Haptic Technology Spectrum may include

Mass/Weight

Stiffness/Detents

Viscosity/Damping

Roughness/Texture

Pulses

Waveforms

Vibrations

Simultaneous Compound Effects

Figure 30:
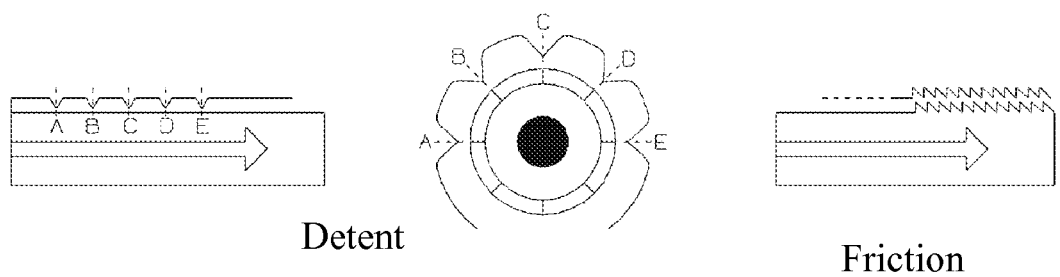
FIG. 30 is a schematic diagram of the haptic functionality.

The surface of the electronics apparatus can be designed with various contours to represent certain predetermined function from the printed film. A single touch on the round recess area will activate the touch pad on the film and the specific signal will channel to the controller through the interconnection. The recess at the rotary area guides the user's finger around the touch pads which is located below the rotary area. Similarly, the recess area for the slider area guides the finger move along the slider to vary the control parameters. User can feel the contour of the surface and at the same time the user can feel the roughness/texture or specific designed protrusion on the surface so as to recognize the specific function of the touch area. A detention can be added to the surface to provide better recognition of touch pad location. FIG. 30 shows the detent and frictional haptic feedback when a finger touches the surface.

An audio device can be added to the system by mounting a buzzer at the back of the opaque plastic moulding. The buzzer will be activated when the finger touch the surface at the area where the touches pad is located.

When the finger is near or touching the touch pad surface, the microcontroller generates a PWM signal to drive a buzzer to produce an audible feedback to user. The audible sound can be pre-programmed with music, song or any warning sound to alert the user. The sound turns off automatically when the finger move away from the sensing area.

Similarly, other haptic devices, such as a vibrator can be mounted at the back of the opaque plastic moulding. The pulses from vibration can be felt by the finger tip when it touches or slides on the surface of the electronics apparatus where the touch pads are printed so that addition feedback to user can be achieved. The vibrator can be a DC motor with an unbalanced counter weight mounted on the shaft. When the finger touches the surface of the apparatus when the touch pad is located, the microcontroller will switch on the motor and when the finger leaves the touch pad, the motor will turn off automatically.

Figure 31:
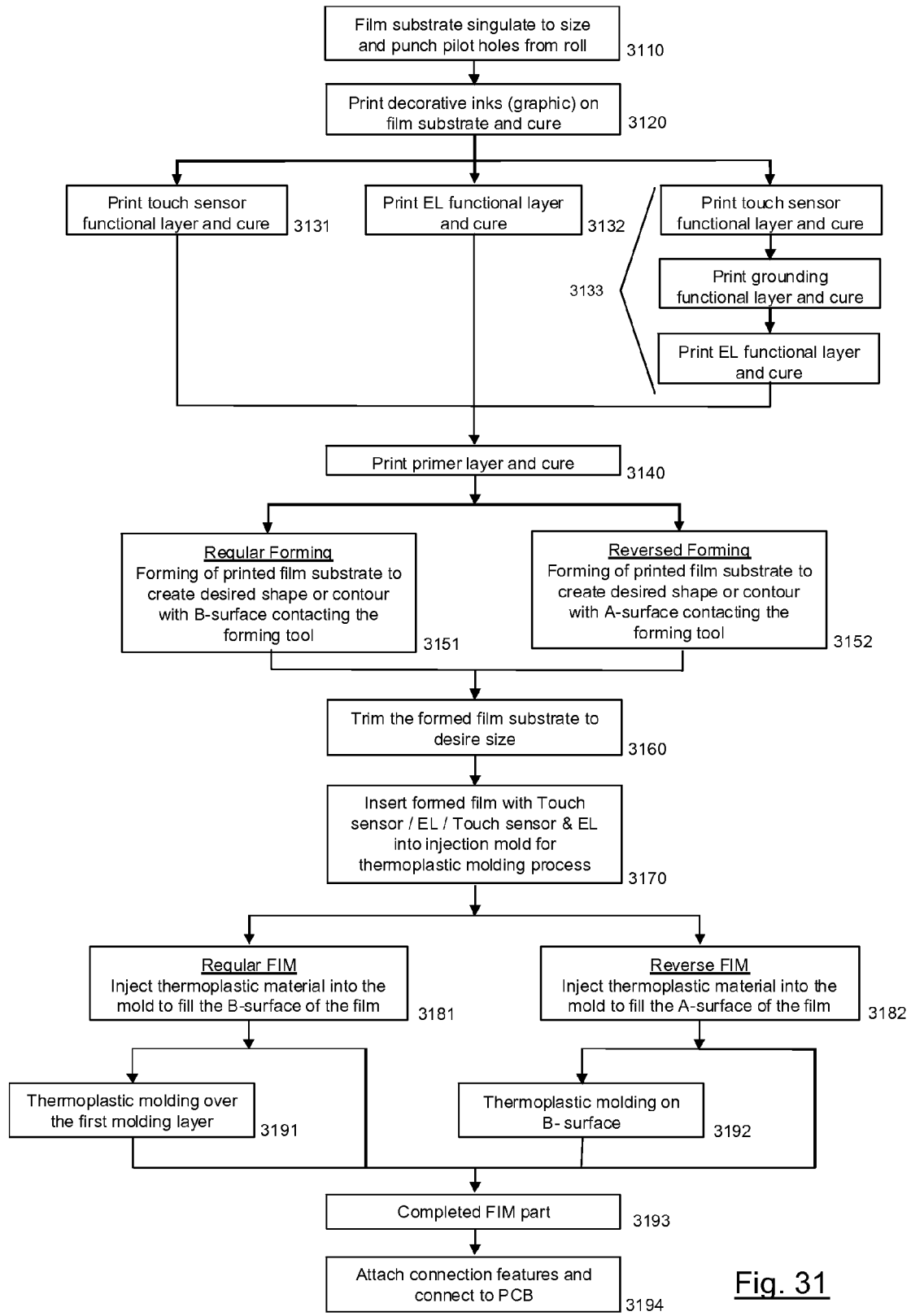
FIG. 31 is a flows chart illustrating a process for manufacturing a 3-dimensional shaped film.

FIG. 31 illustrates the FIM process to produce electronic apparatus such as a touch sensor, lighting or both. It also illustrates different configurations for forming and moulding.

At 3110 the film substrate is cut to size from a roll form. The film substrate can be of polycarbonate or PET. Film thickness varies from 0.175 to 0.5 mm. The surface finish of film substrate includes glossy-glossy, glossy-matt, matt-matt and other special texture such as bushed line.

At 3120 the decorative (graphic) inks layer are printed on B-surface of film substrate. The decorative inks are specially formulated for high pressure thermal forming and meanwhile able to withstand thermoplastic injection moulding without being washed-off.

At 3131 to 3133 the electrical or functional layers may include touch sensor 3131, lighting 3132 or combination of touch sensor & lighting 3133. At 3131 the touch sensor functional layer is printed using electrically conductive ink/paste, including translucent and opaque. The touch sensor functional layer consists of traces and electrodes. The trace width may be >0.2 mm or >0.3 mm at bending or stretching areas depending on product design and other trace parameters, which may minimise the chance of cracking. The trace and/or electrode can be silver paste e.g.: EA-510, manufactured by Advance Electronic Material Inc. In order to thicken (not widen) the trace, the same trace can be printed two layers and above. The curing process needs to complete prior the subsequent printing of new layer. The thickness of each layer varies from 8 to 14 μm.

At 3132 the lighting layer is printed; for example if EL is to be used as a light source, the printing includes a translucent conductive 401, phosphor 402, dielectric 403 and conductive electrode 404.

At 3133 the touch sensor and lighting require a grounding layer in between to block the interference generated by lighting layer; otherwise the touch sensor will not be able to function. The grounding layer consists of a transparent primer and conductive trace (translucent or opaque). The transparent primer may protect against cracking as well as preventing conductive trace wear and oxidation. The primer may be the same family or same manufacturer of the decorative ink. The primer insulates, allows transmission of light, adheres two incompatible layers, protects the conductive trace from wear & corrosion and adheres the printing layer and moulding layer.

At 3140 after printing and curing the functional layer, one to two layers of primer are printed on top. The primer may provide a protection to the functional layer and enable strong adhesion between the functional layer and thermoplastic moulding interface.

At 3151 regular shaping or forming results in a printed film substrate with B-surface or printed surface in contact with the forming tool and the other side of the film substrate exposed to high pressure air. The film substrate will be formed to create the desired shape or contour. In order to minimize the trace circuitry print mark reveal in A-surface, glossy-matt film substrate with thickness 0.25 mm and above can be used.

At 3152 reversed shaping or forming is the opposite to regular forming, so the printed film substrate is formed with A-surface or non-printed surface in contact with the forming tool and the other side of the film substrate exposed to high pressure air. The film substrate will be formed to create desired shape or contour. For this forming method, the thickness of film substrate is 0.25 mm and above.

For single layer conductive trace with a trace width 0.3 mm; the bending radius of any contoured sensing regions may be twice the thickness of the film substrate. For double layer conductive trace with a trace width of 0.3 mm; the bending radius can be slightly reduced. For tighter geometry thicker traces or more trace layers may be required.

At 3160 the formed film substrate is singulated or trimmed to desired size to be mounted in the injection mould cavity. At 3170 the singulated formed film is inserted into injection mould for the thermoplastic moulding process.

At 3181 regular FIM or overmoulding can minimize unpleasant printing marks on A-surface, by using reverse forming film substrate 3152. Thermoplastic material is injected into the mould to fill the B-surface of the film substrate. Typically, the thermoplastic material for this stage is transparent/translucent thermal plastic material; the thickness is more than 1 mm. To avoid decorative ink "wash-off", the gating locating of the injection mould should be appropriately chosen and/or the decorative ink should be adequately cured.

At 3182 reverse FIM or overmoulding injects thermoplastic material into the mould to fill the A-surface of the film. Typically, the thermoplastic material for this stage is transparent/translucent thermal plastic material; the thickness is less than 3 mm.

At 3191 a second thermoplastic moulding is injected over the first moulding layer. Typically the 2nd moulding is opaque. The selective area not moulded with opaque plastic allows light to pass through as backlighting for touch activation points or lighting feedback from an LED.

At 3192 thermoplastic is injected on B-surface, similar to 3191. The 2nd moulding is opaque but moulding is on the opposite side of the transparent moulding. The selective area not moulded with opaque plastic allows light to pass through as backlighting for touch activation points or lighting feedback from an LED.

At 3193 the FIM part is completed. Depending on different requirement and application; 3191, 3181, 3192 or 3182 can be the final stage of electronic apparatus. At 3194 the connector is attached to the electronic apparatus and connected to the PCB.

While exemplary embodiments pertaining to the invention have been described and illustrated, it will be understood by those skilled in the technology concerned that many variations or modifications involving particular design, implementation or construction are possible and may be made without deviating from the claims.

The invention claimed is:

1. A method comprising:
    patterning one or more electrical layers on a substrate to form a patterned substrate, wherein the one or more electrical layers comprise a trace, and wherein the trace comprises a width, a thickness, a number of layers, and a material;
    shaping the patterned substrate into a 3-dimensional contour, wherein the contour comprises a significant change in gradient in or adjacent to one or more sensing areas of the electrical layer;
    changing a gradient of the trace at the significant change in gradient during the shaping to create a bending radius of the trace;
    over-moulding the shaped substrate, and
    substantially minimising degradation of the trace in the electrical layer at the significant change in gradient during at least one of the shaping, the changing, or the over-moulding based on at least two of: the width of the trace, the thickness of the trace, the number of layers of the trace, the bending radius of the trace, the material of the trace, or a primer over layer on the trace.

2. The method of claim 1, wherein the width is >0.2 mm.

3. The method of claim 1, wherein substantially minimising the degradation of the trace in the electrical layer is based on the number of layers of the trace, and wherein the number of layers is a double or triple layer.

4. The method of claim 1, wherein substantially minimising the degradation of the trace in the electrical layer is based on the bending radius of the trace, and wherein the bending radius is at least two times the substrate thickness.

5. The method of claim 1, wherein substantially minimising the degradation of the trace in the electrical layer is based on the material of the trace, and wherein the material is silver paste which is highly conductive, ductile and/or has a high bonding strength to the substrate.

6. The method of claim 1, wherein substantially minimising the degradation of the trace in the electrical layer is based on the primer over layer on the trace, and wherein the primer over layer comprises a first transparent primer layer on a first electrical layer, a second electrical layer on the first transparent primer layer and a second transparent primer layer on the second electrical layer.

7. The method of claim 6, further comprising patterning a third electrical layer on the second transparent primer layer, wherein the first, second and third electrical layer are configured for substantially different electrical functions and the first electrical layer being at least partially transparent.

8. The method of claim 7, wherein the second electrical layer is a grounded shielding layer and the third electrical layer is a electroluminescent (EL) layer, alternating current electroluminescent (ACEL) layer, direct current electroluminescent (DCEL) layer, or organic LED (OLED) layer.

9. The method of claim 1, wherein a thickness of the substrate is >0.25 mm or between 0.175 to 0.5 mm.

10. The method of claim 1, wherein the shaping is high pressure thermal forming with regular or reverse configuration.

11. The method of claim 1, wherein the over-moulding is film insert moulding with regular or reverse configuration, and comprises injection moulding a thermoplastic layer of >1 mm, or between 0.8 to 5 mm.

12. The method of claim 1, wherein the over-moulded substrate is an electronic interface including touch and/or proximity sensors.

13. The method of claim 12, wherein the touch and/or proximity sensors include haptic feedback selected from the group consisting of: lighting of the sensing area, mass/weight of sensor threshold, stiffness/detents, viscosity/damping, roughness/texture of the sensing area, pulses, waveforms, vibrations and any combination thereof.

14. The method of claim 1, further comprising forming an interconnect from the electrical layer to a controller, the interconnect selected from the group consisting of:
    a conductive ink circuit or pig tail,
    an anisotropic conductive film adhesive on a side wall, parallel to and/or close to an appearance surface,
    an anisotropic conductive film adhesive on a side wall, parallel to and/or close to an appearance surface with a compression load,
    an anisotropic conductive film adhesive behind a decorative surface,
    an anisotropic conductive film adhesive behind a decorative surface with an elastomeric fastening,
    an anisotropic conductive film adhesive on a side wall, perpendicular and/or close to an appearance surface,
    an elastomeric connector behind a decorative surface, and an elastomeric connector on side wall, parallel to and/or close to an appearance surface.

15. An electronic interface comprising:
a controller, and
a 3-dimensional contoured over-moulded substrate manufactured according to the method of claim 14,
wherein the interconnect is configured to connect the electrical layer to the controller and the sensing areas are configured to provide user input to the controller.

16. The electronic apparatus of claim 15, wherein the 3-dimensional contoured over-moulded substrate includes a surface characteristic.

17. The electronic apparatus of claim 16, wherein the surface characteristic is antimicrobial, oleophobic, and/or a hydrophobic.

18. The electronic apparatus of claim 17, wherein the surface characteristic is film applied, spray applied, or mixture integrated.

19. A method for manufacturing a shaped film, the method comprising:
applying a functional ink layer on one of a plurality of film layers; the functional ink layer having an associated function;
forming the plurality of film layers into a 3-dimensional shape with a contoured portion,
contouring the functional ink layer during the forming, wherein the functional ink layer in the contoured portion retains a level of conductivity after the forming such that the function can still be performed after the forming.

20. The method of claim 19, wherein forming the plurality of film layers into a 3-dimensional shape with a contoured portion comprises forming the functional ink layer and the plurality of film layers into the 3-dimensional shape, and where the method further comprises subjecting the plurality of film layers to an injection mold process by inserting the plurality of film layers into an injection mold after the forming, and injecting plastic resin over the plurality of film layers so as to form a molded plastic layer over the film layers.

* * * * *